US012610510B2

(12) United States Patent
Baek et al.

(10) Patent No.: US 12,610,510 B2
(45) Date of Patent: Apr. 21, 2026

(54) DISPLAY DEVICE AND MANUFACTURING METHOD THEREOF

(71) Applicant: Samsung Display Co., LTD., Yongin-si (KR)

(72) Inventors: Seung Hwan Baek, Yongin-si (KR); Jeongjin Kim, Yongin-si (KR); Joosuc Kim, Yongin-si (KR); Jaehyun Jo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 140 days.

(21) Appl. No.: 18/535,391

(22) Filed: Dec. 11, 2023

(65) Prior Publication Data

US 2024/0260247 A1     Aug. 1, 2024

(30) Foreign Application Priority Data

Jan. 30, 2023     (KR) ........................ 10-2023-0011719

(51) Int. Cl.
| | |
|---|---|
| *H05K 13/00* | (2006.01) |
| *G02B 5/30* | (2006.01) |
| *G02F 1/1333* | (2006.01) |
| *G06F 1/16* | (2006.01) |

(52) U.S. Cl.
CPC ....... *H05K 13/0015* (2013.01); *G02B 5/3025* (2013.01); *G02F 1/133354* (2021.01); *G06F 1/1637* (2013.01)

(58) Field of Classification Search
CPC ...... G02F 1/133308–133331; G02F 1/133354; G06F 1/1637; H04M 1/0266; H04M 1/0268
See application file for complete search history.

(56) References Cited

U.S. PATENT DOCUMENTS

| | | | |
|---|---|---|---|
| 10,796,633 B2 | 10/2020 | Ahn et al. | |
| 2021/0311238 A1* | 10/2021 | Lee | .................. G02F 1/133638 |
| 2021/0318718 A1* | 10/2021 | Ahn | ...................... G06F 1/1607 |
| 2022/0035409 A1* | 2/2022 | Heo | ...................... H10K 77/111 |
| 2023/0015839 A1* | 1/2023 | Han | ...................... H10K 59/873 |

FOREIGN PATENT DOCUMENTS

| | | | | |
|---|---|---|---|---|
| CN | 112908158 A | * | 6/2021 | .......... H04M 1/0269 |
| CN | 113823658 A | * | 12/2021 | .......... H10K 59/8791 |
| KR | 102343734 B1 | | 12/2021 | |

* cited by examiner

*Primary Examiner* — Mariceli Santiago
(74) *Attorney, Agent, or Firm* — CANTOR COLBURN LLP

(57) ABSTRACT

A display device includes a display panel which is divided into a first region including pixels and having a corner portion and a side portion adjacent to the corner portion, a second region bent with respect to an imaginary bending axis extending in a first direction, and a third region in which a driver chip electrically connected to the pixels is mounted, where an alignment part is disposed in the corner portion, and a support member which is disposed below the first region of the display panel, includes a support corner portion and a support side portion adjacent to the support corner portion, and exposes the alignment part. An edge of the side portion is aligned with an edge of the support side portion in a thickness direction.

10 Claims, 23 Drawing Sheets

BB

MP

P-MP
AM-OP
AM
DP
CL
MP-CN-E

DP-CN-E

DR2
DR1 ⊗ DR3

DISPLAY DEVICE AND MANUFACTURING METHOD THEREOF

This application claims priority to Korean Patent Application No. 10-2023-0011719, filed on Jan. 30, 2023, and all the benefits accruing therefrom under 35 U.S.C. § 119, the content of which in its entirety is herein incorporated by reference.

BACKGROUND

1. Field

The present disclosure herein relates to a display device and a manufacturing method thereof, and more particularly, to a display device including a support member and a manufacturing method thereof.

2. Description of the Related Art

Various display devices used for multi-media devices such as a television, a mobile phone, a tablet computer, a navigation system, and a game console are being developed. A display device may be manufactured by bonding components such as a display panel and a support member. Components such as a display panel and a support member may include alignment parts. By adjusting the bonding positions of components using alignment parts, it is possible to improve bonding reliability of a display panel. Recently, as shapes of display devices are diversified, studies are being conducted on how to align and bond components.

SUMMARY

The present disclosure provides a display device with improved or high bonding reliability.

The present disclosure also provides a manufacturing method of a display device with improved bonding reliability.

An embodiment of the invention provides a display device including: a display panel which is divided into a first region including pixels and having a corner portion in which an alignment part is disposed and a side portion adjacent to the corner portion, a second region bent with respect to an imaginary bending axis extending in a first direction, and a third region in which a driver chip electrically connected to the pixels is mounted; and a support member which is disposed below the first region of the display panel, includes a support corner portion and a support side portion adjacent to the support corner portion, and exposes the alignment part, where an edge of the side portion is aligned with an edge of the support side portion in a thickness direction.

In an embodiment, the support member may be provided with an opening which is defined in a portion adjacent to the support corner portion and overlaps the alignment part, and the alignment part may be entirely exposed from the opening.

In an embodiment, an edge of the support corner portion may be aligned with an edge of the corner portion in the thickness direction.

In an embodiment, when viewed in the thickness direction, an area of the opening may be greater than an area of the alignment part.

In an embodiment, an edge portion of the support corner portion may have a shape recessed toward the inside of the support member and be disposed further inward than an edge portion of the corner portion, and the alignment part may be disposed between the edge portion of the support corner portion and the edge portion of the corner portion.

In an embodiment, the display device may further include a polarizing layer disposed on the display panel, where the polarizing layer may include a polarizing corner portion and a polarizing side portion adjacent to the polarizing corner portion, and an edge of the polarizing side portion may be aligned, in the thickness direction, with the edge of the support side portion and the edge of the side portion.

In an embodiment, the display device may further include an adhesive layer disposed on the polarizing layer, where the adhesive layer may include an adhesive corner portion and an adhesive side portion adjacent to the adhesive corner portion, and an edge of the adhesive side portion may be aligned, in the thickness direction, with the edge of the polarizing side portion, the edge of the support side portion, and the edge of the side portion.

In an embodiment, the side portion may include a first side portion, a second side portion opposite to the first side portion, and a third side portion disposed between the first side portion and the second side portion, the support side portion may include a first side support portion, a second side support portion opposite to the first side support portion, a third side support portion disposed between the first side support portion and the second side support portion, and a fourth side support portion facing the third side support portion, and an edge portion of the first side portion may be aligned with an edge of the first side support portion in the thickness direction, an edge portion of the second side portion may be aligned with an edge of the second side support portion in the thickness direction, an edge portion of the third side portion may be aligned with an edge of the third side support portion in the thickness direction, and the fourth side support portion is more adjacent to the second region than the first side support portion.

In an embodiment, the support member may be provided with a first component opening defined therein, and the display panel may be provided with a second component opening defined, in the first region, in a portion thereof corresponding to the first component opening, the display device may further include an electronic component overlapping the first component opening and the second component opening.

In an embodiment of the invention, a manufacturing method of a display device includes: providing a preliminary display panel including an alignment part and divided into a first region, a second region, and a third region, which are arranged in a first direction: providing a preliminary support member which is disposed on the preliminary display panel, has a greater area than the first region, does not overlap the third region, and is provided with a support opening defined therein; providing the preliminary support member on the preliminary display panel such that the support opening and the alignment part overlap each other; and simultaneously cutting the preliminary support member and the preliminary display panel by irradiating the preliminary support member with a laser.

In an embodiment, the simultaneously cutting the preliminary support member and the preliminary display panel may include cutting the preliminary support member and the preliminary display panel such that at least one edge portion of the preliminary display panel and at least one edge portion of the preliminary support member are aligned with each other in a thickness direction.

In an embodiment, the simultaneously cutting the preliminary support member and the preliminary display panel may include irradiating the preliminary support member with the laser toward the preliminary display panel.

In an embodiment, the simultaneously cutting the preliminary support member and the preliminary display panel may include cutting, with the laser, a section between the support opening and an edge portion of the preliminary support member on the basis of the preliminary support member.

In an embodiment, the simultaneously cutting the preliminary support member and the preliminary display panel may include cutting the preliminary display panel exposed by the support opening with the laser.

In an embodiment, the cutting the preliminary display panel exposed by the support opening with the laser may include cutting a section between the alignment part and an edge portion of the preliminary display panel on the basis of the preliminary display panel.

In an embodiment, the method may include, before the providing the preliminary support member on the preliminary display panel in a way such that the support opening and the alignment part overlap each other and before the simultaneously cutting the preliminary support member and the preliminary display panel by irradiating the preliminary support member with the laser, forming a preliminary cutting line on the preliminary support member by half-cutting the preliminary support member.

In an embodiment, the simultaneously cutting the preliminary support member and the preliminary display panel may include irradiating the preliminary cutting line with the laser.

In an embodiment, the method may further include, before the simultaneously cutting the preliminary support member and the preliminary display panel by irradiating the preliminary support member with the laser, providing a preliminary polarizing plate below the preliminary display panel, where an area of the preliminary polarizing plate may be greater than an area of the preliminary support member.

In an embodiment, the method may further include, after the providing of the preliminary polarizing plate below the preliminary display panel, providing an adhesive layer below the preliminary polarizing plate.

In an embodiment, the method may further include cutting the preliminary display panel by irradiating, with the laser, a portion of the preliminary display panel not overlapping the preliminary support member.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1A:
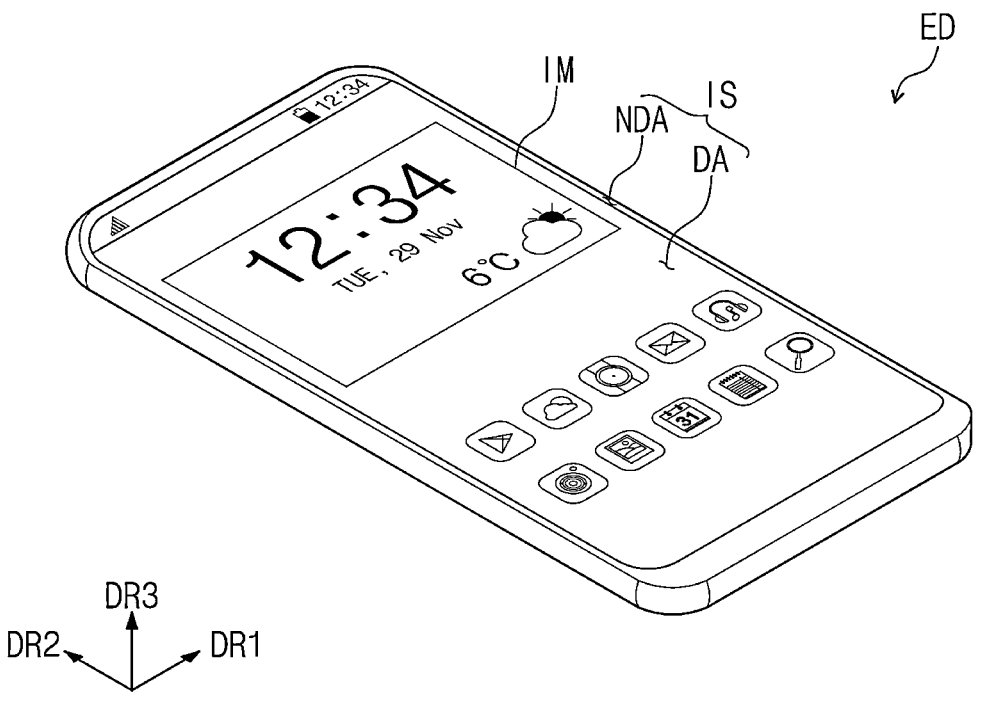
FIG. 1A is a perspective view illustrating an electronic device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will be understood that when an element (or a region, a layer, a portion, or the like) is referred to as "being on", "connected to" or "coupled to" another element, it may be directly disposed on/connected/coupled to the other element, or intervening elements may be disposed therebetween.

In this specification, it will be understood that "being directly disposed" means that there are no intervening layers, films, regions, plates, or the like between a portion of layers, films, regions, plates, or the like and another portion. For example, "being directly disposed" may mean to be disposed between two layers or two members without using an additional member such as an adhesive member or like.

Like reference numerals or symbols refer to like elements throughout. In the drawings, the thickness, the ratio, and the dimension of the elements are exaggerated for effective description of the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the invention.

The terms such as "below", "lower", "above", "upper" and the like, may be used herein for the description to describe one element's relationship to another element illustrated in the figures. It will be understood that the terms have a relative concept and are described on the basis of the orientation depicted in the figures. In this specification, "being disposed on" may mean to be disposed not only on an upper part but also on a lower part of one member.

Unless otherwise defined, all terms (including technical and scientific terms) used herein have the same meaning as commonly understood by one of ordinary skill in the art to which the present disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display device according to an embodiment of the invention and a manufacturing method thereof will be described with reference to the accompanying drawings.

Figure 1B:
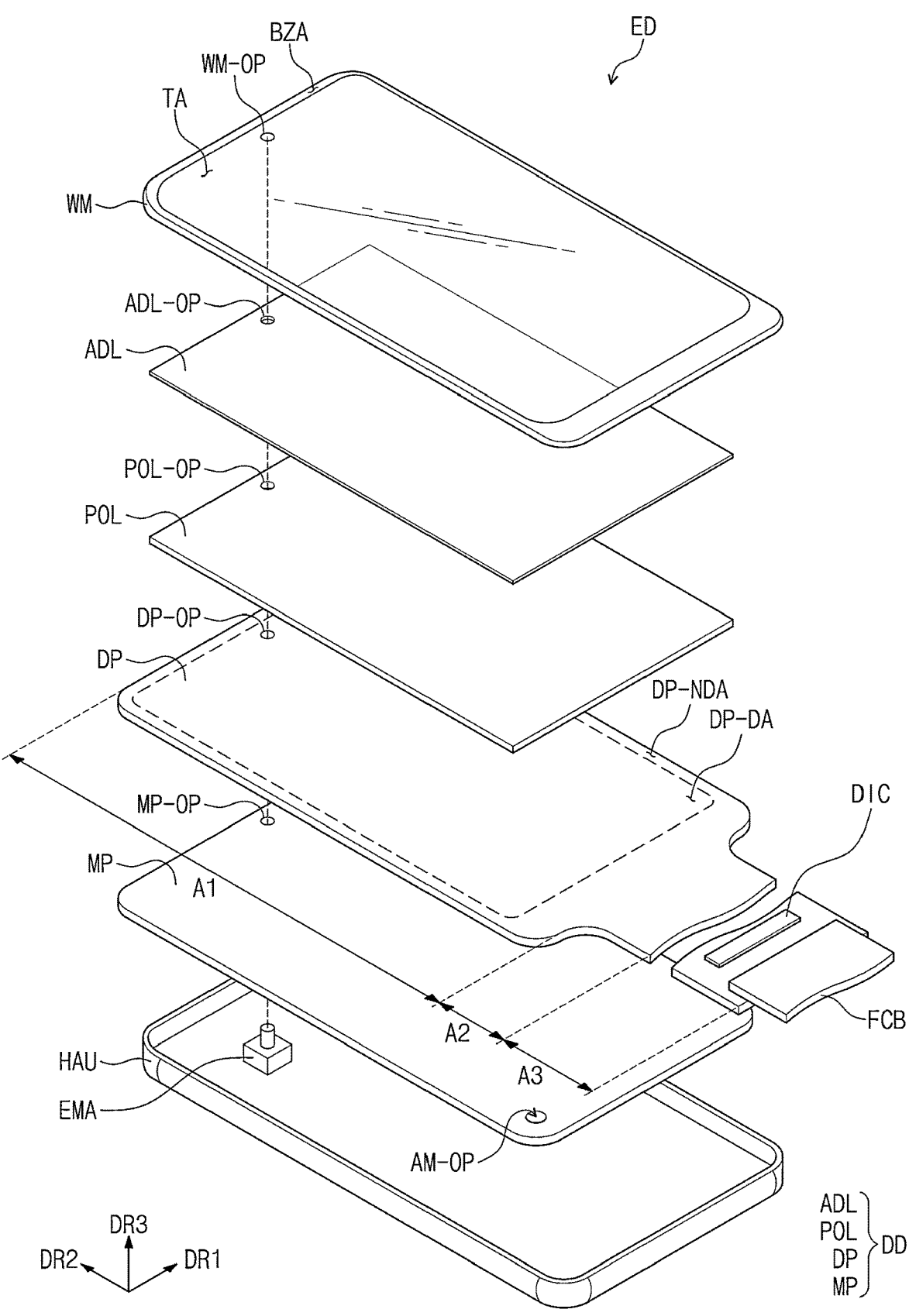
FIG. 1B is an exploded perspective view of an electronic device according to an embodiment.
Figure 1C:
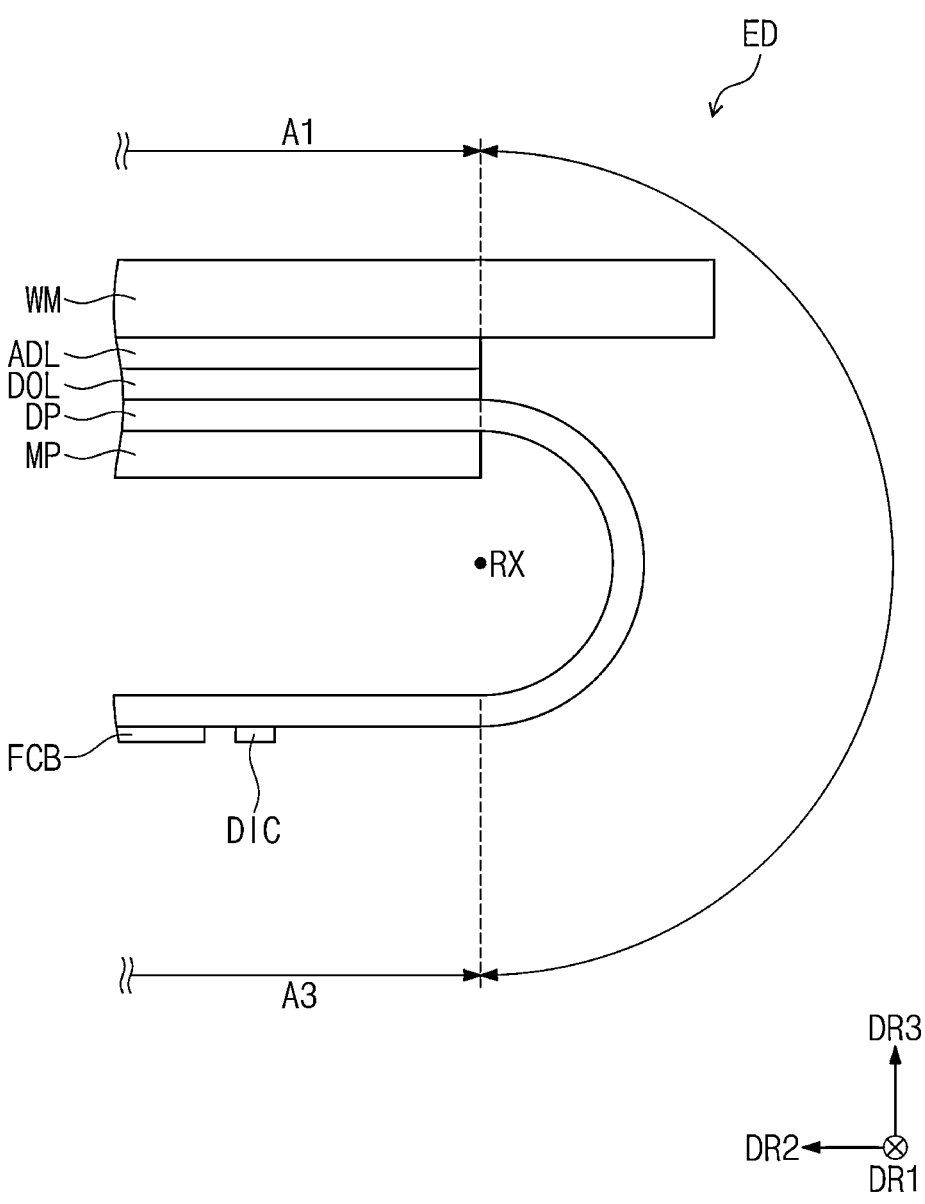
FIG. 1C is an enlarged cross-sectional view of a portion of an electronic device according to an embodiment.

FIG. 1A is a perspective view illustrating an electronic device ED according to an embodiment. FIG. 1B is an exploded perspective view of the electronic device ED according to an embodiment. FIG. 1C is an enlarged cross-sectional view of a portion of the electronic device according to an embodiment. FIG. 1C is a cross-sectional view illustrating the electronic device ED in which a second region A2 is bent with respect to an imaginary axis RX extending in a first direction DR1.

Referring to FIG. 1A, the electronic device ED according to an embodiment may be a device activated in response to an electrical signal. For example, the electronic device ED according to an embodiment may be a mobile phone, a tablet computer, a car navigation system, a game console, and a wearable device, but an embodiment of the invention is not limited thereto. Hereinafter, for convenience of description, embodiments where the electronic device ED is a mobile phone will be described in detail.

A display surface IS, which is parallel to a plane defined by a first direction axis DR1 and a second direction axis DR2, may be defined in the electronic device ED according to an embodiment. The electronic device ED according to an embodiment may display an image IM on the display surface IS in a direction of a third direction axis DR3 perpendicular to the first direction axis DR1 and the second direction axis DR2. Here, the direction of the third direction axis DR3 may a thickness direction of the electronic device ED.

The display surface IS is divided into an active region DA and a peripheral region NDA. The active region DA may be a region which is activated in response to an electrical signal and in which the image IM is displayed. The peripheral region NDA may be a region in which the image IM is not displayed and which has a predetermined color. The peripheral region NDA may surround the active region DA. Accordingly, a shape of the active region DA may be substantially defined by the peripheral region NDA.

However, this is merely an example, and an embodiment of the invention is not limited thereto. In an embodiment, for example, the peripheral region NDA may be defined only on one side of the active region DA, or may be omitted. Accordingly, the electronic device ED according to an embodiment may include active regions having various shapes and is not limited to any one embodiment.

In FIG. 1A and the following drawings, the first direction axis DR1 to the third direction axis DR3 are illustrated, and the directions indicated by the first to third direction axes DR1, DR2, and DR3 described herein may have a relative concept and thus may be changed to other directions. In addition, the directions indicated by the first to third direction axes DR1, DR2, and DR3 may be referred to as first to third directions, and thus may be denoted as the same reference numerals or symbols.

Referring to FIGS. 1B and 1C, the electronic device ED according to an embodiment may include a display device DD, a window WM, an electronic component EMA, and a housing HAU.

The display device DD according to an embodiment may include a support member MP and a display panel DP.

The support member MP may be disposed below the display panel DP. The support member MP may protect the display panel DP against an external impact. The support member MP may be disposed below the display panel DP and function to adjust colors visible to a user to be neutral black when power is turned off. That is, the support member MP may adjust the display quality of the display device DD according to an embodiment.

The support member MP may include a metal. In an embodiment, for example, the support member MP may include steel use stainless (SUS). However, this is merely an example, and an embodiment of the invention is not limited thereto. As long as capable of protecting the display panel DP and adjusting the display quality of the display device DD according to an embodiment, any metal may be used without a limitation.

An opening AM-OP may be defined in one corner of the support member MP. The opening AM-OP may expose a later-described alignment part AM (see FIG. 2A) of the display panel DP. Therefore, such an embodiment of the display device DD including the support member MP exposing the alignment part AM (see FIG. 2A) may have improved bonding reliability.

In an embodiment, the support member MP may be provided with a second component opening MP-OP defined therein.

The display panel DP may be disposed on the support member MP. The display panel DP may be disposed between the support member MP and the window WM. The display panel DP may be activated in response to an electrical signal to generate an image. The image generated from the display panel DP may correspond to the image IM (see FIG. 1) displayed on the display surface IS (see FIG. 1) of the electronic device ED. The display panel DP may be one selected from an organic light-emitting display panel, a quantum-dot display panel, and an inorganic light-emitting display panel, but is not particularly limited.

The display panel DP may be divided into a display region DP-DA and a non-display region DP-NDA. The display region DP-DA may be a portion in which an image is generated, and the non-display region DP-NDA may be a portion in which an image is not generated.

The display region DP-DA may correspond to the active region DA (see FIG. 1A) of the electronic device ED, and the non-display region DP-NDA may correspond to the peripheral region NDA (see FIG. 1A) of the electronic device ED. The non-display region DP-NDA may be adjacent to the display region DP-DA. In an embodiment, for example, the non-display region DP-NDA may surround the display region DP-DA. However, this is merely illustrated as an example. The non-display region DP-NDA may be defined in various shapes and is not limited to any one embodiment.

The display panel DP may include a first region A1, a second region A2, and a third region A3. The first region A1 may include pixels. Accordingly, the first region A1 may include the display region DP-DA. In this specification, a region, other than the display region DP-DA, of the first region A1, the second region A2, and the third region A3, may correspond to the non-display region DP-NDA.

In an embodiment, the second region A2 may be bent with respect to the imaginary axis RX extending in the first direction DR1 such that the third region A3 faces the rear surface of the display module DM. In such an embodiment, a driver chip DIC and a flexible circuit board FCB may be disposed below the first region A1. The third region A3 may include the driver chip DIC mounted therein and pads disposed adjacent to an end thereof. The flexible circuit board FCB may be disposed on the pads in the third region A3 and be electrically connected to the display panel DP.

The display panel DP may include the alignment part AM (see FIG. 2A) disposed on a surface adjacent to the support member MP. The alignment part AM will be described later in greater detail with reference to FIGS. 2A to 4.

In an embodiment, the display panel DP may be provided with a first component opening DP-OP defined therein.

The window WM may be disposed above the display panel DP. At least a portion of the window WM may transmit an image generated from the display panel DP. The window WM may include or be composed of glass, a polymer film, or the like. However, this is merely an example, and an embodiment of the invention is not limited thereto.

The window WM may be divided into a transmission region TA and a bezel region BZA. The transmission region TA may transmit an image generated from the display panel DP. The transmission region TA may correspond to the display region DP-DA of the display panel DP. The transmission region TA may correspond to the active region DA of the electronic device ED.

The bezel region BZA may be a portion having a predetermined color. The bezel region BZA may correspond to the non-display region DP-NDA of the display panel DP. The bezel region BZA may correspond to the peripheral region NDA of the electronic device ED.

In an embodiment, the window WM may be provided with a third component opening WM-OP defined therein.

The electronic component EMA may include various functional modules. In an embodiment, the electronic component EMA may be a component that receives an external input or outputs an electrical signal. In an embodiment, for example, the electronic component EMA may be a proximity sensor, an infrared sensor, a camera, or the like. However, this is merely an example, and an embodiment of the invention is not limited thereto. In an embodiment, the electronic component EMA may be accommodated in a display opening DD-OP of the display device DD and a window opening WM-OP of the window. Therefore, a separate space for accommodating the electronic component EMA may be omitted in the electronic device ED, and thus the thickness of the electronic device ED may be reduced.

The housing HAU may be coupled to the window WM to constitute the exterior of the electronic device ED. The housing HAU may accommodate the display device DD. The housing HAU may accommodate other components in addition to the illustrated display device DD.

The display device DD according to an embodiment may further include a polarizing plate POL disposed on the display panel DP. The polarizing plate POL may function to prevent reflection of light incident on the display device DD from the outside. The polarizing plate POL may be provided with a fourth component opening POL-OP defined therein. In an alternative embodiment, the polarizing plate POL may be omitted.

The display device DD according to an embodiment may further include an adhesive layer ADL disposed on the polarizing plate POL. The adhesive layer ADL may bond the display device DD and other components. In an embodiment, for example, the adhesive layer ADL may bond the display device DD and the window WM. The adhesive layer ADL may be an optical clear adhesive (OCA) layer, a pressure sensitive adhesive (PSA) layer, or an optical clear resin (OCR) layer. The adhesive layer ADL may be provided with a fifth component opening ADL-OP defined therein. In an alternative embodiment, the adhesive layer ADL may be omitted.

Figure 2A:
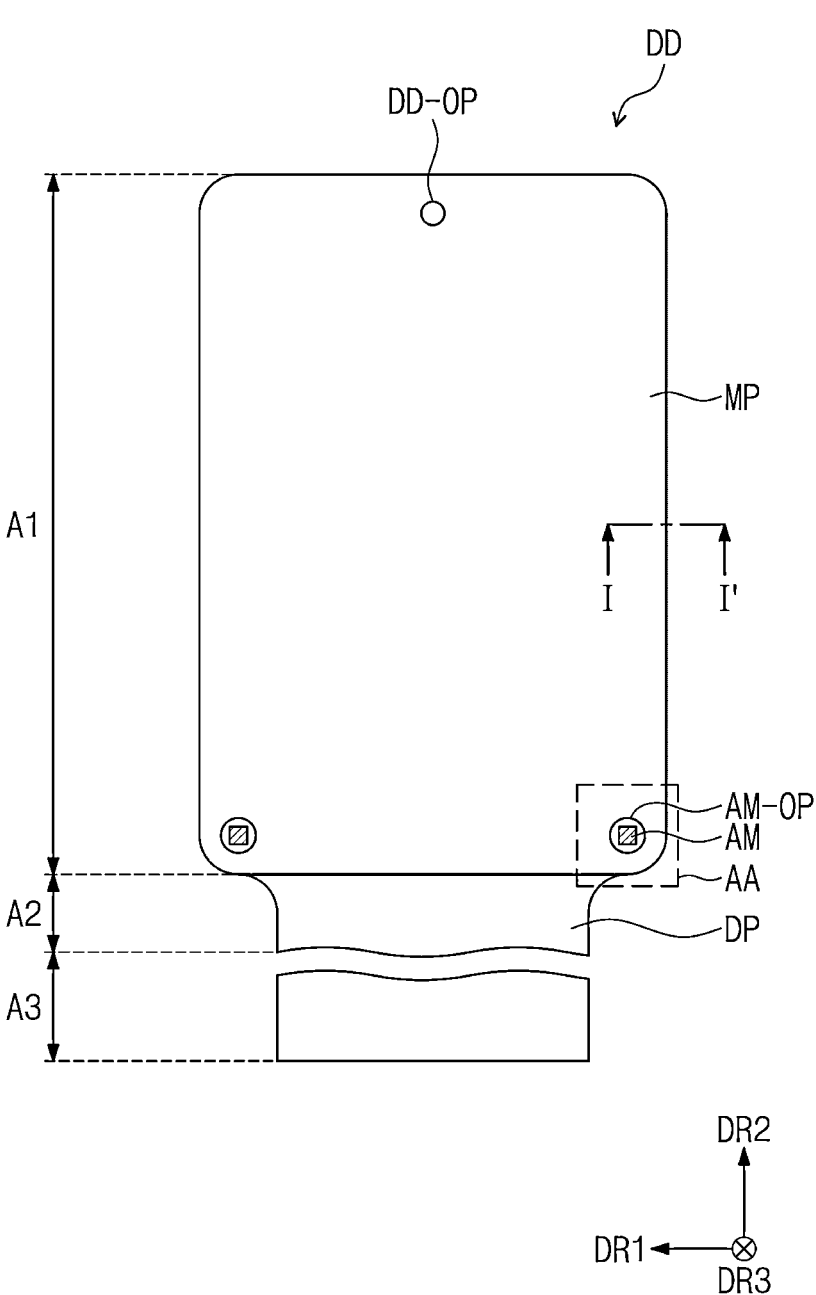
FIG. 2A is a plan view of a display device according to an embodiment.
Figure 2B:
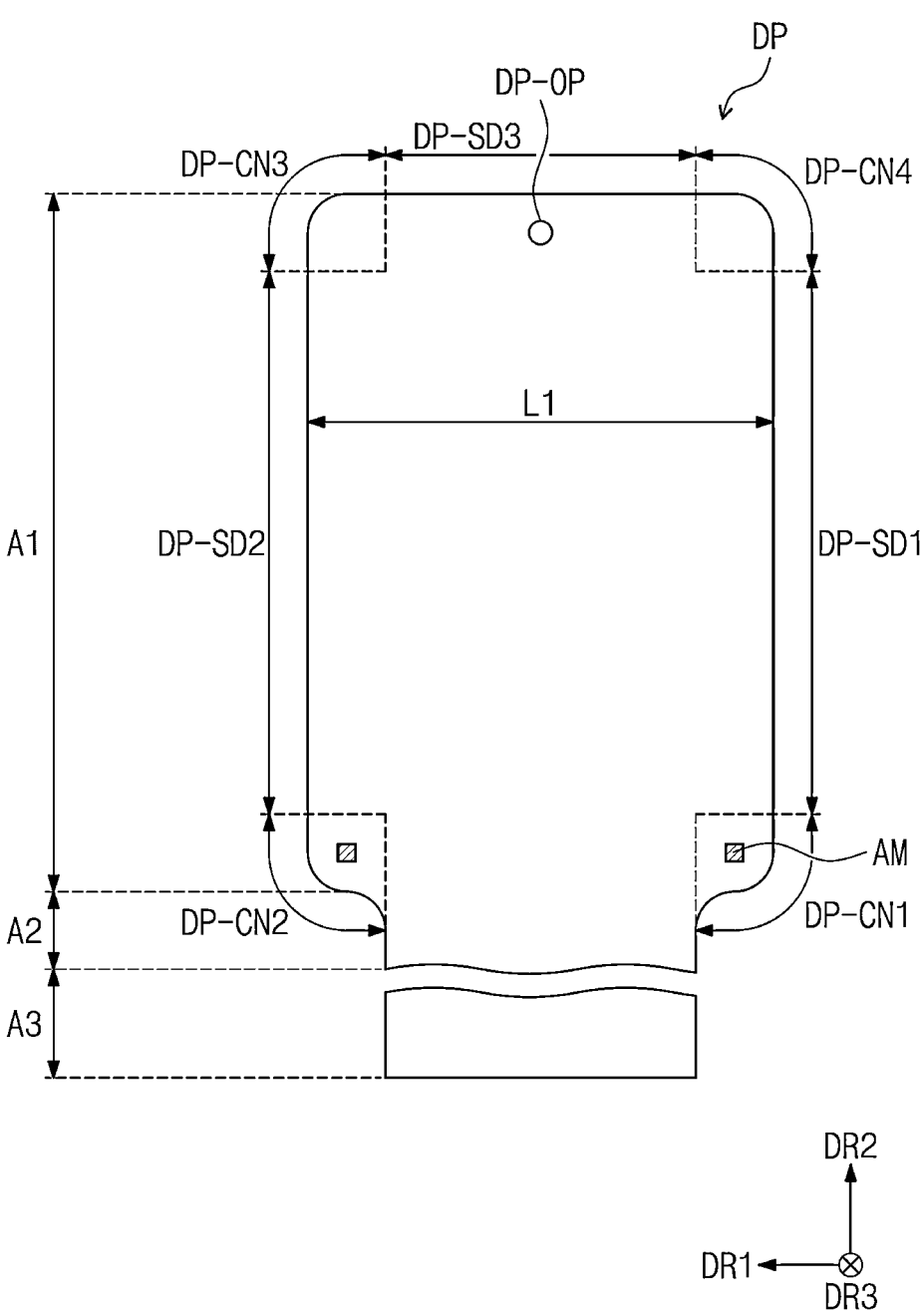
FIG. 2B is a plan view of a display panel according to an embodiment.
Figure 2C:
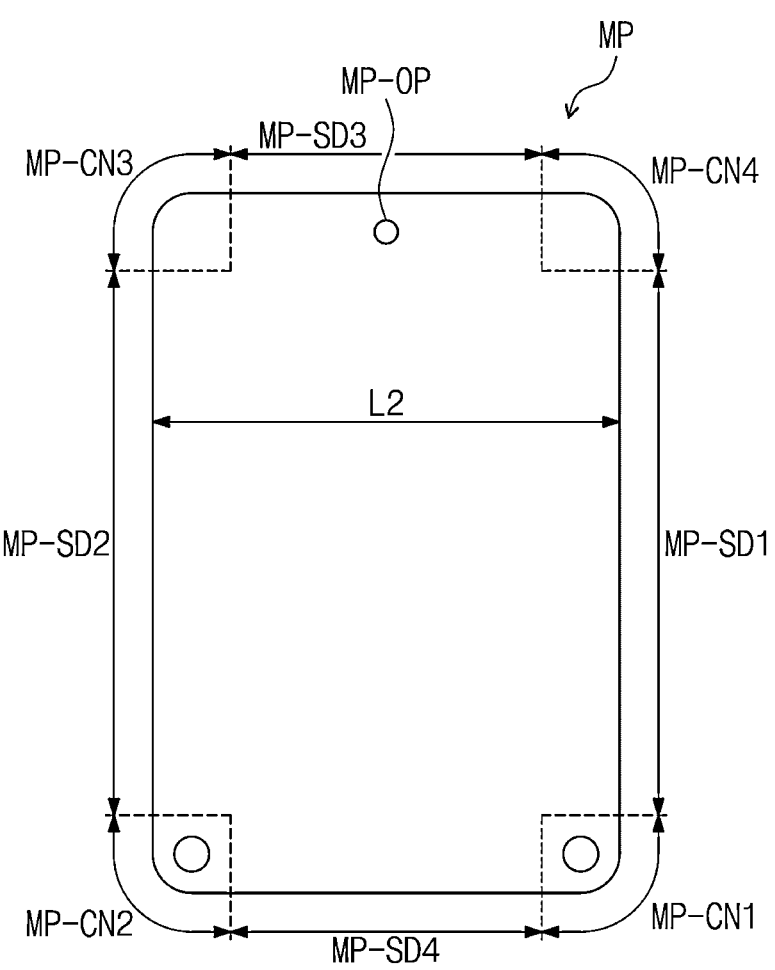
FIG. 2C is a plan view of a support member according to an embodiment.
Figure 2C:
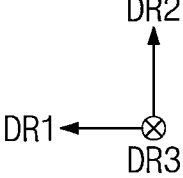
Figure 2D:
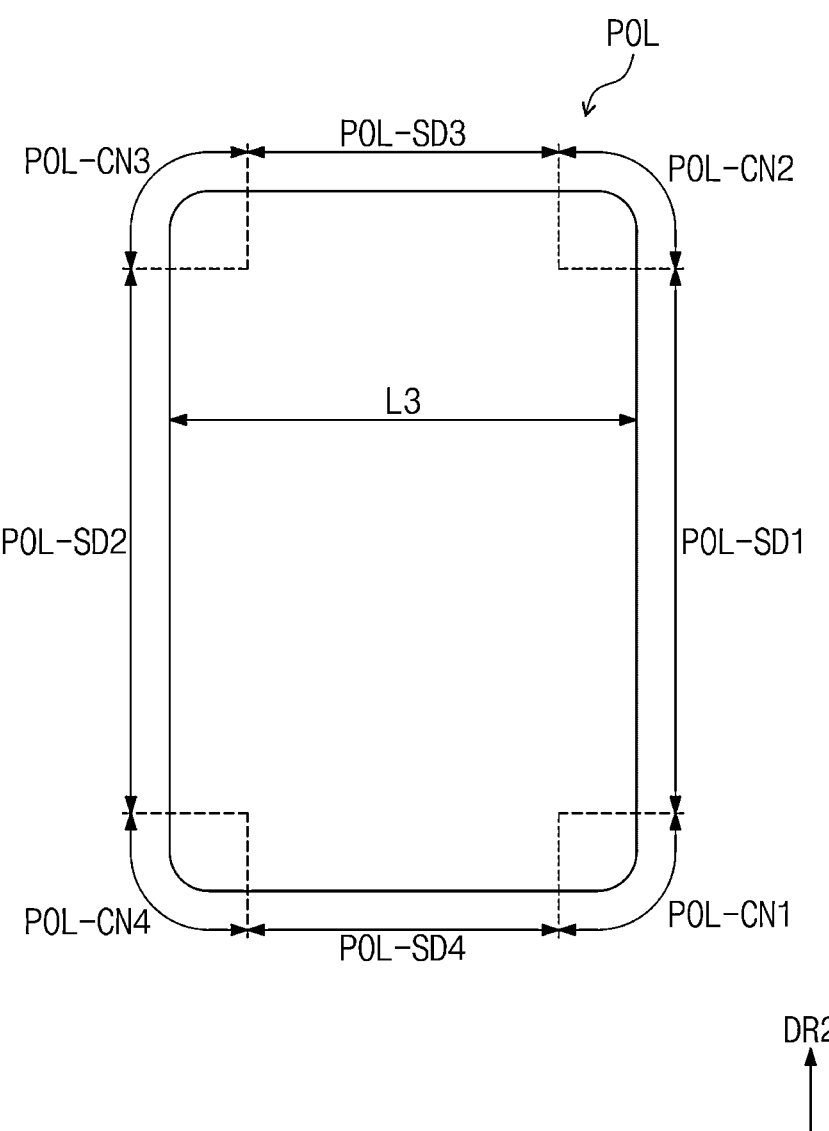
FIG. 2D is a plan view of a polarizing plate according to an embodiment.
Figure 2E:
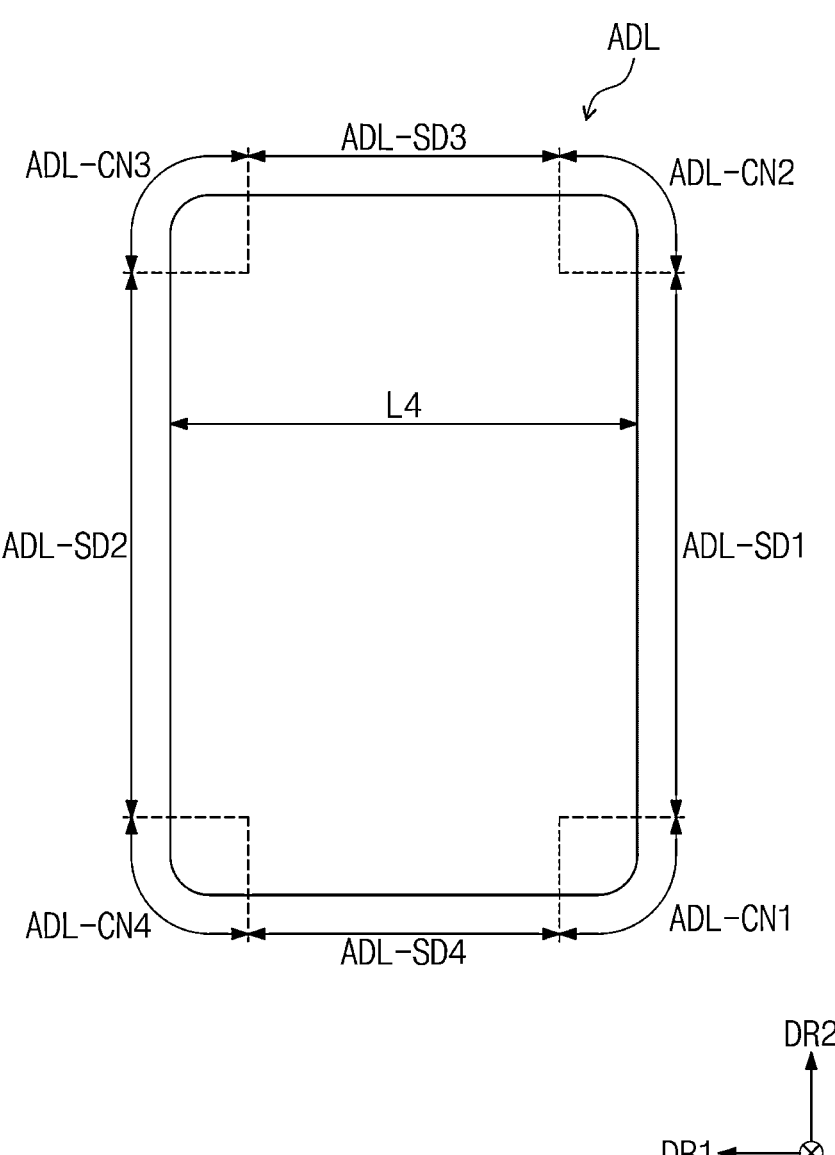
FIG. 2E is a plan view of an adhesive layer according to an embodiment.
Figure 2F:
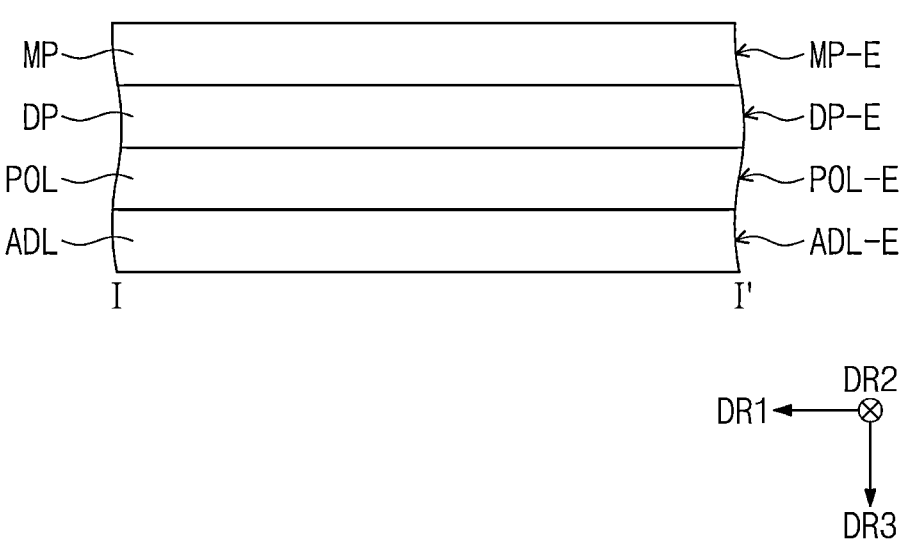
FIG. 2F is a cross-sectional view of a display device according to an embodiment.

FIG. 2A is a plan view of a display device according to an embodiment. FIG. 2B is a plan view of a display panel according to an embodiment. FIG. 2C is a plan view of a support member according to an embodiment. FIG. 2D is a plan view of a polarizing plate according to an embodiment. FIG. 2E is a plan view of an adhesive layer according to an embodiment. FIG. 2F is a cross-sectional view of a display device according to an embodiment.

Referring to FIGS. 2A to 2C, in an embodiment, a display panel DP may include at least one corner portion DP-CN1 to DP-CN4. In an embodiment, for example, the display panel DP may include first to fourth corner portions DP-CN1 to DP-CN4. However, this is merely an example, and an embodiment of the invention is not limited thereto. In an alternative embodiment, the display panel DP may have five or more corner portions and is not limited to the shape having four corner portions. Hereinafter, for convenience of description, embodiments where the display panel DP has four corner portions will be described in detail.

The display panel DP according to an embodiment may include side portions DP-SD1 to DP-SD4. In an embodiment, the display panel DP may include a first side portion DP-SD1 disposed between the first corner portion DP-CN1 and the fourth corner portion DP-CN4, a second side portion DP-SD2 disposed between the third corner portion DP-CN3 and the second corner portion DP-CN2, and a third side portion DP-SD3 disposed between the fourth corner portion DP-CN4 and the third corner portion DP-CN3. The first side portion DP-SD1 and the second side portion DP-SD2 may be opposite to each other. The third side portion DP-SD3 may be disposed between the first side portion DP-SD1 and the second side portion DP-SD2.

In an embodiment, the display panel DP may include an alignment part AM. The alignment part AM may be disposed in a first region A1. The alignment part AM may be disposed or defined in at least one of the corner portions DP-CN1 to DP-CN4 of the display panel DP. FIG. 2B illustrates an embodiment where the alignment part AM is disposed in the first corner portion DP-CN1 and the second corner portion DP-CN2 of the display panel, but an embodiment of the invention is not limited thereto. In an alternative embodiment, for example, the alignment part AM may be disposed only in one corner portion among the first corner portion DP-CN1 and the second corner portion DP-CN2 or may be disposed in two or more corner portions among the first to fourth corner portions DP-CN1 to DP-CN4.

The alignment part AM may be an identification mark for aligning the bonding position in which other components disposed below the display panel DP are bonded. In an embodiment, for example, the bonding position of the housing HAU (see FIG. 1B) disposed below the display panel DP may be adjusted by using the alignment part AM. However, this is merely an example, and an embodiment of the invention is not limited thereto. The alignment part AM may allow the bonding positions, in which other components other than the housing HAU are bonded with the display panel DP, to be adjusted.

The display panel DP may be further provided with a first component opening DP-OP defined therein. The first component opening DP-OP may correspond to the display opening DD-OP of the display device DD. The electronic component EMA (see FIG. 1B) may be exposed through the first component opening DP-OP.

In an embodiment, a support member MP may include at least one support corner portion MP-CN1 to MP-CN4. In an embodiment, for example, the support member MP may include first to fourth support corner portions MP-CN1 to MP-CN4. However, this is merely an example, and an embodiment of the invention is not limited thereto. In an alternative embodiment, the support member MP may have five or more support corner portions and is not limited to the shape having four support corner portions. Hereinafter, for convenience of description, embodiments where the support member MP has four corner portions will be described.

The support member MP according to an embodiment may include support side portions MP-SD1 to MP-SD4. In an embodiment, the support member MP may include a first support side portion MP-SD1 disposed between the first support corner portion MP-CN1 and the fourth support corner portion MP-CN4, a second support side portion MP-SD2 disposed between the third support corner portion MP-CN3 and the second support corner portion MP-CN2, a third support side portion MP-SD3 disposed between the fourth support corner portion MP-CN4 and the third support corner portion MP-CN3, and a fourth support side portion MP-SD4 disposed between the first support corner portion MP-CN1 and the second support corner portion MP-CN2.

The first support side portion MP-SD1 and the second support side portion MP-SD2 may be opposite to each other. The third support side portion MP-SD3 may be disposed between the first support side portion MP-SD1 and the second support side portion MP-SD2. The third support side portion MP-SD3 may face the fourth support side portion MP-SD4. In an embodiment, the fourth support side portion MP-SD4 may be more adjacent to a second region A2 than the first support side portion MP-SD1.

In an embodiment, the support member MP may expose the alignment part AM of the display panel DP. In an embodiment, an opening AM-OP may be defined in one corner of the support member MP. FIG. 2C illustrates an embodiment where the opening AM-OP is defined in portions adjacent to the first support corner portion MP-CN1 and the second support corner portion MP-CN2 of the support member MP, but an embodiment of the invention is not limited thereto. In an alternative embodiment, for example, the opening AM-OP may be defined in one of the portions adjacent to the first support corner portion MP-CN1 and the second support corner portion MP-CN2 or may be defined in at least two of the first to fourth support corner portions MP-CN1 to MP-CN4.

The opening AM-OP may overlap the alignment part AM of the display panel DP. The opening AM-OP may expose the alignment part AM of the display panel DP. Since the opening AM-OP exposes the alignment part AM, the bonding reliability between the display panel DP and components disposed below the display panel DP may be improved due to the alignment part AM.

In an embodiment, the support member MP may be further provided with a second component opening MP-OP defined therein. The second component opening MP-OP may correspond to the display opening DD-OP of the display device DD. The electronic component EMA (see FIG. 1B) may be exposed through the second component opening MP-OP.

The display device DD according to an embodiment may further include a polarizing plate POL. Referring to FIG. 2D, in an embodiment, the polarizing plate POL may include at least one polarizing corner portion POL-CN1 to POL-CN4. In an embodiment, for example, the polarizing plate POL may include first to fourth polarizing corner portions POL-CN1 to POL-CN4. However, this is merely an example, and an embodiment of the invention is not limited thereto. In an alternative embodiment, the polarizing plate POL may have five or more polarizing corner portions, and the polarizing member is not limited to the shape having four polarizing corner portions.

The polarizing plate POL according to an embodiment may include polarizing side portions POL-SD1 to POL-SD4. In an embodiment, the polarizing plate POL may include a first polarizing side portion POL-SD1 disposed between the first polarizing corner portion POL-CN1 and the second polarizing corner portion POL-CN2, a second polarizing side portion POL-SD2 disposed between the third polarizing corner portion POL-CN3 and the fourth polarizing corner portion POL-CN4, a third polarizing side portion POL-SD3 disposed between the second polarizing corner portion POL-CN2 and the third polarizing corner portion POL-CN3, and a fourth polarizing side portion POL-SD4 disposed between the first polarizing corner portion POL-CN1 and the fourth polarizing corner portion POL-CN4. In an embodiment, the fourth polarizing side portion POL-SD4 may be more adjacent to the second region A2 than the first polarizing side portion POL-SD1.

The first polarizing side portion POL-SD1 and the second polarizing side portion POL-SD2 may be opposite to each other. The third polarizing side portion POL-SD3 may be disposed between the first polarizing side portion POL-SD1 and the second polarizing side portion POL-SD2. The third polarizing side portion POL-SD3 may face the fourth polarizing side portion POL-SD4.

In an embodiment, the polarizing plate POL may be provided with a polarizing opening POL-OP defined therein. The polarizing opening POL-OP may correspond to the display opening DD-OP of the display device DD. The electronic component EMA (see FIG. 1B) may be exposed through the polarizing opening POL-OP.

The display device DD according to an embodiment may further include an adhesive layer ADL. Referring to FIG. 2E, in an embodiment, the adhesive layer ADL may include at least one adhesive corner portion ADL-CN1 to ADL-CN4. In an embodiment, for example, the adhesive layer ADL may include first to fourth adhesive corner portions ADL-CN1 to ADL-CN4. However, this is merely an example, and an embodiment of the invention is not limited thereto. In an alternative embodiment, the adhesive layer ADL may have five or more adhesive corner portions, and the adhesive member is not limited to the shape having four adhesive corner portions. Hereinafter, for convenience of description, embodiments where the adhesive layer ADL has four corner portions will be described.

The adhesive layer ADL according to an embodiment may include adhesive side portions ADL-SD1 to ADL-SD4. In an embodiment, the adhesive layer ADL may include a first adhesive side portion ADL-SD1 disposed between the first adhesive corner portion ADL-CN1 and the second adhesive corner portion ADL-CN2, a second adhesive side portion ADL-SD2 disposed between the third adhesive corner portion ADL-CN3 and the fourth adhesive corner portion ADL-CN4, a third adhesive side portion ADL-SD3 disposed between the second adhesive corner portion ADL-CN2 and the third adhesive corner portion ADL-CN3, and a fourth adhesive side portion ADL-SD4 disposed between the first adhesive corner portion ADL-CN1 and the fourth adhesive corner portion ADL-CN4. The fourth adhesive side portion ADL-SD4 may be more adjacent to the second region A2 than the first adhesive side portion ADL-SD1.

The first adhesive side portion ADL-SD1 and the second adhesive side portion ADL-SD2 may be opposite to each other. The third adhesive side portion ADL-SD3 may be disposed between the first adhesive side portion ADL-SD1 and the second adhesive side portion ADL-SD2. The third adhesive side portion ADL-SD3 may face the fourth adhesive side portion ADL-SD4.

In an embodiment, the adhesive layer ADL may be provided with an adhesive opening ADL-OP defined therein. The adhesive opening ADL-OP may correspond to the display opening DD-OP of the display device DD. The electronic component EMA (see FIG. 1B) may be exposed through the adhesive opening ADL-OP.

Referring to FIGS. 2A, 2B, 2C, and 2F, at least one edge portion DP-E of the display panel DP may be aligned with at least one edge portion MP-E of the support member MP in the thickness direction (or the third direction DR3). Here, the thickness direction is parallel to the third direction axis DR3. The edge portion DP-E of the display panel DP illustrated in FIG. 2F may correspond to the edge portion of the first side portion DP-SD1, and the edge portion MP-E of the support member MP may correspond to the edge portion of the first support side portion MP-SD1. That is, the edge portion DP-E of the first side portion DP-SD1 adjacent to the first corner portion DP-CN1 may be aligned, in the thickness direction, with the edge portion MP-E of the first support side portion MP-SD1 adjacent to the first support corner portion MP-CN1.

However, this is merely an example, and an embodiment of the invention is not limited thereto. Alternatively, other edge portions of the display panel DP and the support member MP corresponding to each other may be aligned with each other in the thickness direction. In an embodiment, the edge portion of the second side portion DP-SD2 may be aligned, in the thickness direction, with the edge portion of the second support side portion MP-SD2. Accordingly, the width L1 of the display panel DP of the first region A1 in the first direction DR1 may be substantially the same as the width L2 of the support member MP in the first direction DR1. The edge portion of the third side portion DP-SD3 may be aligned, in the thickness direction, with the edge portion of the third support side portion MP-SD3.

Referring again to FIG. 2D, at least one edge portion DP-E of the display panel DP, at least one edge portion MP-E of the support member MP, and at least one edge portion POL-E of the polarizing plate POL may be aligned with each other in the thickness direction. The edge portion DP-E of the display panel DP, the edge portion MP-E of the support member MP, and the edge portion POL-E of the polarizing plate POL, which are illustrated in FIG. 2F, may respectively correspond to the edge portion of the first side portion DP-SD1, the edge portion of the first support side portion MP-SD1, and the edge portion of the first polarizing side portion POL-SD1. That is, the edge portion DP-E of the first side portion DP-SD1 adjacent to the first corner portion DP-CN1, the edge portion MP-E of the first support side portion MP-SD1 adjacent to the first support corner portion MP-CN1, and the edge portion POL-E of the first polarizing side portion POL-SD1 adjacent to the first polarizing corner portion POL-CN1 may be aligned with each other in the thickness direction.

However, this is merely an example, and an embodiment of the invention is not limited thereto. Alternatively, other edge portions of the display panel DP, the support member MP, and the polarizing plate POL corresponding to each other may be aligned with each other in the thickness direction. In an embodiment, the edge portion of the second side portion DP-SD2, the edge portion of the second support side portion MP-SD2, and the edge portion of the second polarizing side portion POL-SD2 may be aligned with each other in the thickness direction. Accordingly, the width L1 of the display panel DP of the first region A1 in the first direction DR1, the width L2 of the support member MP in the first direction DR1, and the width L3 of the polarizing plate POL in the first direction DR1 may be substantially the same as each other. In addition, the edge portion of the third side portion DP-SD3, the edge portion of the third support side portion MP-SD3, and the edge portion of the third polarizing side portion POL-SD3 may be aligned with each other in the thickness direction. The edge portion of the fourth support side portion MP-SD4 and the edge portion of the fourth polarizing side portion POL-SD4 may be aligned with each other in the thickness direction. The fourth polarizing side portion POL-SD4 may be more adjacent to the first region A1 than the first polarizing side portion POL-SD1 is.

Referring again to FIG. 2E, at least one edge portion DP-E of the display panel DP, at least one edge portion MP-E of the support member MP, at least one edge portion POL-E of the polarizing plate POL, and at least one edge portion ADL-E of the adhesive layer ADL may be aligned with each other in the thickness direction. The edge portion DP-E of the display panel DP, the edge portion MP-E of the support member MP, the edge portion POL-E of the polarizing plate POL, and the edge portion ADL-E of the adhesive layer ADL, which are illustrated in FIG. 2F, may respectively correspond to the edge portion of the first side portion DP-SD1, the edge portion of the first support side portion MP-SD1, the edge portion of the first polarizing side portion POL-SD1, and the edge portion of the first adhesive side portion ADL-SD1. That is, the edge portion DP-E of the first side portion DP-SD1 adjacent to the first corner portion DP-CN1, the edge portion MP-E of the first support side portion MP-SD1 adjacent to the first support corner portion MP-CN1, the edge portion POL-E of the first polarizing side portion POL-SD1 adjacent to the first polarizing corner portion POL-CN1, and the edge portion ADL-E of the first adhesive side portion ADL-SD1 adjacent to the first adhesive corner portion ADL-CN1 may be aligned with each other in the thickness direction.

However this is merely an example, and an embodiment of the invention is not limited thereto. In an alternative embodiment, other edge portions of the display panel DP, the support member MP, the polarizing plate POL, and the adhesive layer ADL corresponding to each other may be aligned with each other in the thickness direction. The edge portion of the second side portion DP-SD2, the edge portion of the second support side portion MP-SD2, the edge portion of the second polarizing side portion POL-SD2, and the edge portion of the second adhesive side portion ADL-SD2 may be aligned with each other in the thickness direction. Therefore, the width L1 of the display panel DP in the first region A1 in the first direction DR1, the width L2 of the support member MP in the first direction DR1, the width L3 of the polarizing plate POL in the first direction DR1, and the width L4 of the adhesive layer ADL in the first direction DR1 may be substantially the same as each other. In addition, the edge portion of the third side portion DP-SD3, the edge portion of the third support side portion MP-SD3, the edge portion of the third polarizing side portion POL-SD3, and the edge portion of the third adhesive side portion ADL-SD3 may be aligned with each other in the thickness direction. The edge portion of the fourth side portion DP-SD4, the edge portion of the fourth support side portion MP-SD4, the edge portion of the fourth polarizing side portion POL-SD4, and the edge portion of the fourth adhesive side portion ADL-SD4 may be aligned with each other in the thickness direction.

Figure 3:
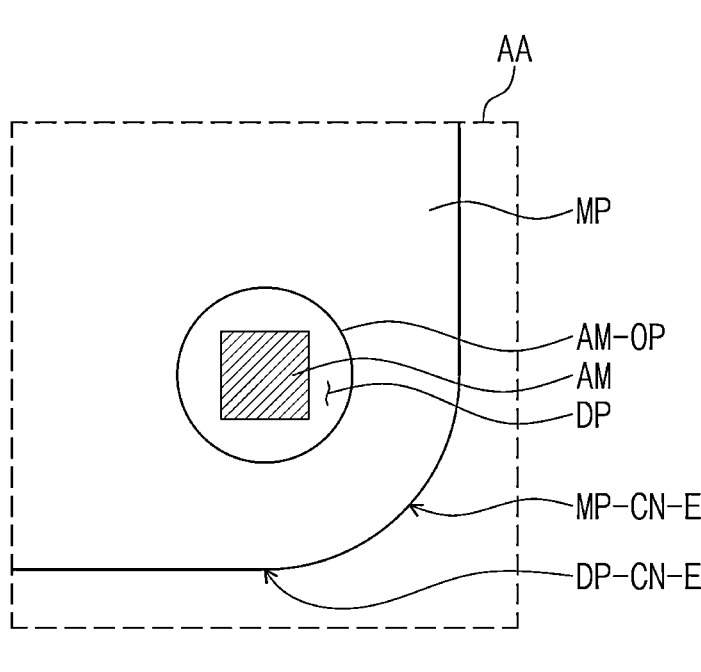
FIG. 3 is an enlarged view of a portion of a display device according to an embodiment.

FIG. 3 is an enlarged view of a portion of a display device according to an embodiment. Particularly, FIG. 3 is an enlarged view taken along line AA of FIG. 2A.

Referring to FIG. 3, in an embodiment, an opening AM-OP may overlap an alignment part AM. The opening AM-OP may expose the alignment part AM. When viewed from the top or when viewed in the third direction DR3, the area of the opening AM-OP may be greater than the area of the alignment part AM. The alignment part AM may be entirely exposed from the opening AM-OP. Therefore, it is possible to improve the bonding reliability of the display device DD according to an embodiment.

FIG. 3 illustrates an embodiment where the opening AM-OP has a circular shape, but an embodiment of the invention is not limited thereto. Alternatively, the opening AM-OP may have a quadrilateral, polygonal, or oval shape. In an embodiment, as shown in FIG. 3, the alignment part AM has a quadrilateral shape, but an embodiment of the invention is not limited thereto. Alternatively, the alignment part AM may have a quadrilateral, polygonal, or oval shape.

Referring to FIGS. 2A to 2C, and FIG. 3 together, an edge portion DP-CN-E of the first corner portion DP-CN1 of the display panel DP may be aligned, in the thickness direction, with an edge portion MP-CN-E of the first support corner portion MP-CN1 of the support member MP. That is, in the display device DD according to an embodiment, the edge portion DP-CN-E of the first corner portion DP-CN1 of the display panel DP may be aligned, in the thickness direction, with the edge portion MP-CN-E of the first support corner portion MP-CN1 of the support member MP, and the alignment part AM may be entirely exposed from the opening AM-OP. Therefore, the bonding reliability of the display device DD according to an embodiment may be improved.

Figure 4:
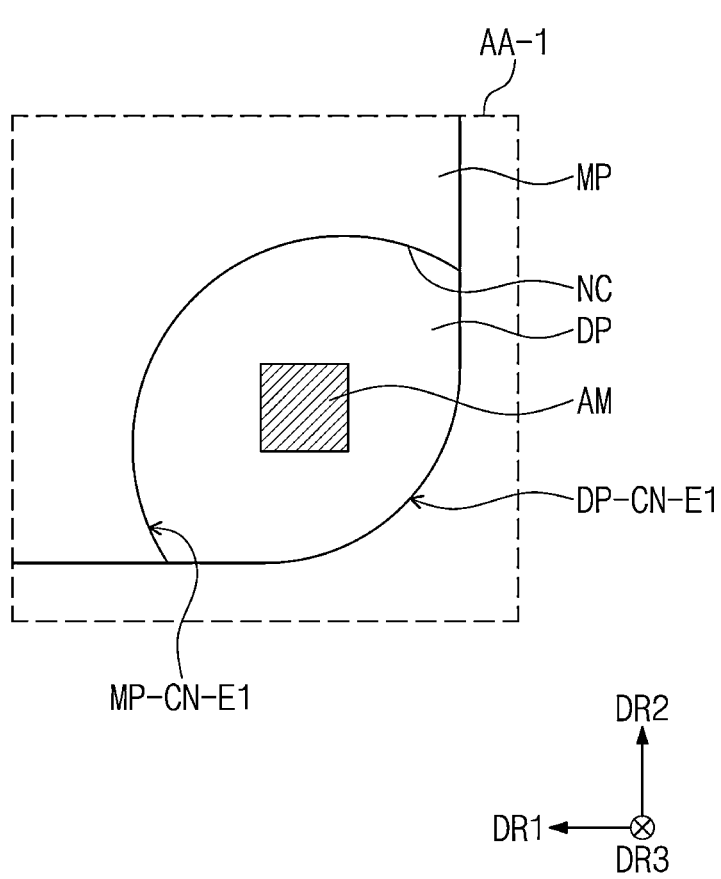
FIG. 4 is an enlarged view of a portion of a display device according to an embodiment.

FIG. 4 is an enlarged view of a portion of a display device according to an embodiment. FIG. 4 is an enlarged view of the portion corresponding to AA illustrated in FIG. 2A. Any repetitive detailed description of the same or like elements as those described above with the references to FIGS. 1 to 3 will be omitted, and the following description will be mainly focused on the differences. The embodiment shown in FIG. 4 is substantially the same as the embodiment shown in FIGS. 1 to 3 except that a recessed portion exposing the alignment part is defined in the support member instead of an opening exposing the alignment part.

Referring to FIG. 4, in an embodiment, an edge portion MP-CN-E1 of a first support corner portion MP-CN1 (see FIG. 2C) of a support member MP-1 may have a shape recessed toward the inside of the support member MP-1. That is, a recessed portion NC recessed toward the inside of the support corner portion MP-CN1 may be defined in the support member MP-1.

The edge portion MP-CN-E1 of the first support corner portion MP-CN1 (see FIG. 2C) may be disposed further inward than an edge portion DP-CN-E1 of a corner portion DP-CN (see FIG. 2B). An alignment part AM may be disposed between the edge portion MP-CN-E1 of the first support corner portion MP-CN1 (see FIG. 2C) and the edge portion DP-CN-E1 of the corner portion DP-CN (see FIG. 2B). The alignment part AM may be exposed from the support member MP. The display device according to an embodiment may include the alignment part AM exposed from the support member MP, thereby exhibiting the improved bonding reliability.

Hereinafter, a manufacturing method of a display device according to an embodiment will be described in detail with reference to FIGS. 5 to 13B.

Figure 5:
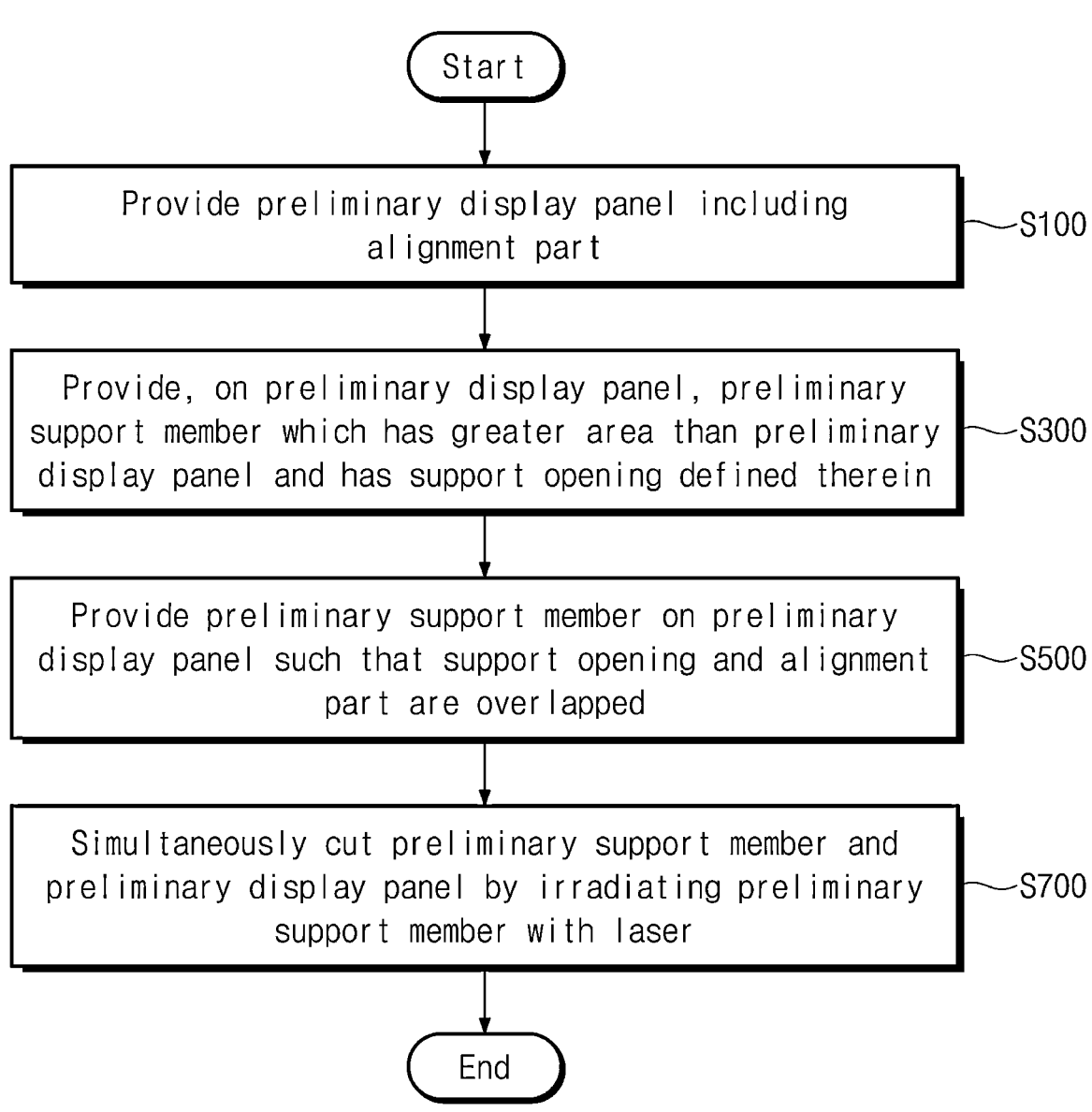
FIG. 5 is a flowchart of a manufacturing method of a display device according to an embodiment.
Figure 6:
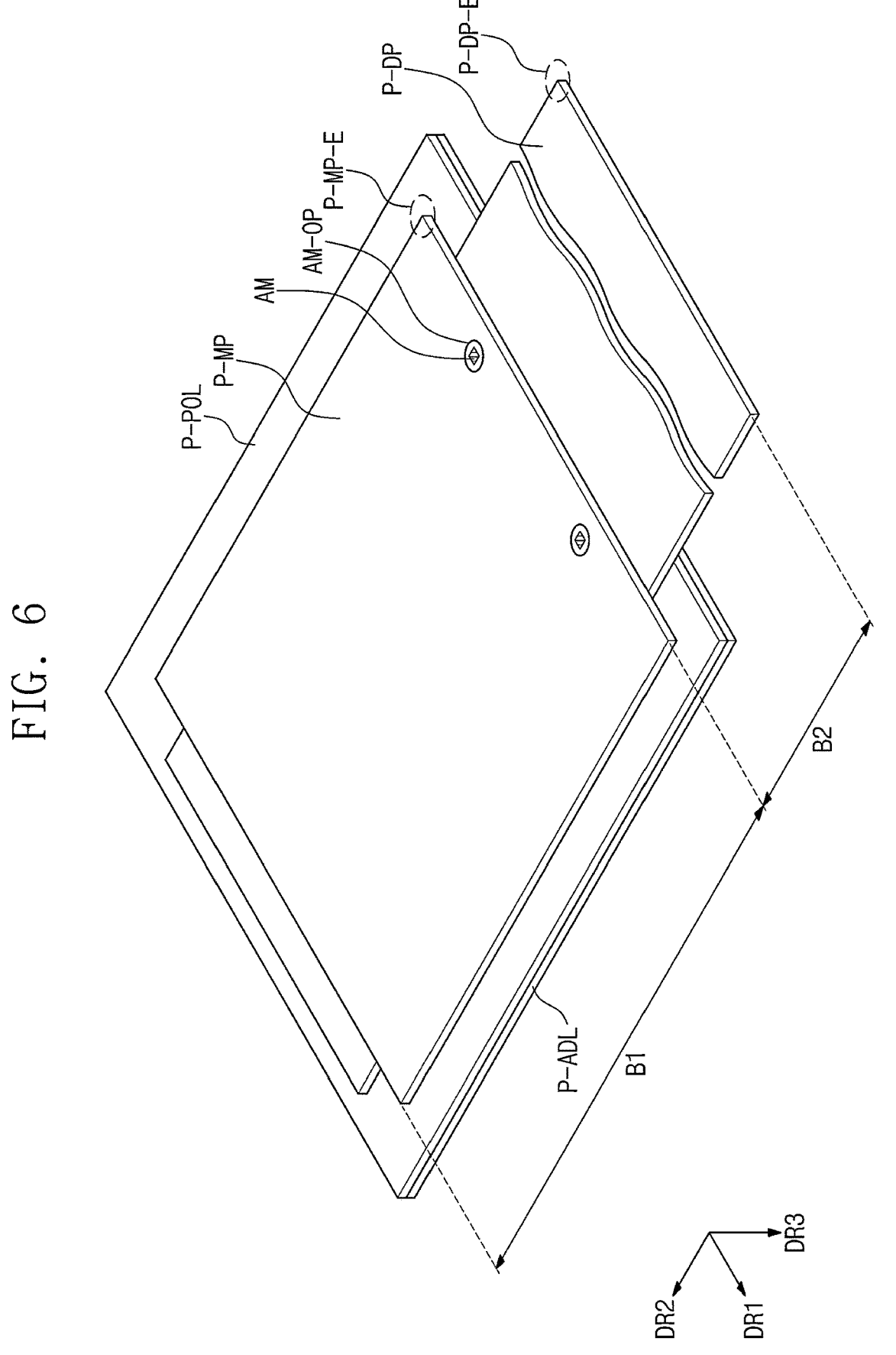
FIG. 6 is a view schematically illustrating an operation of a manufacturing method of a display device according to an embodiment.
Figure 7A:
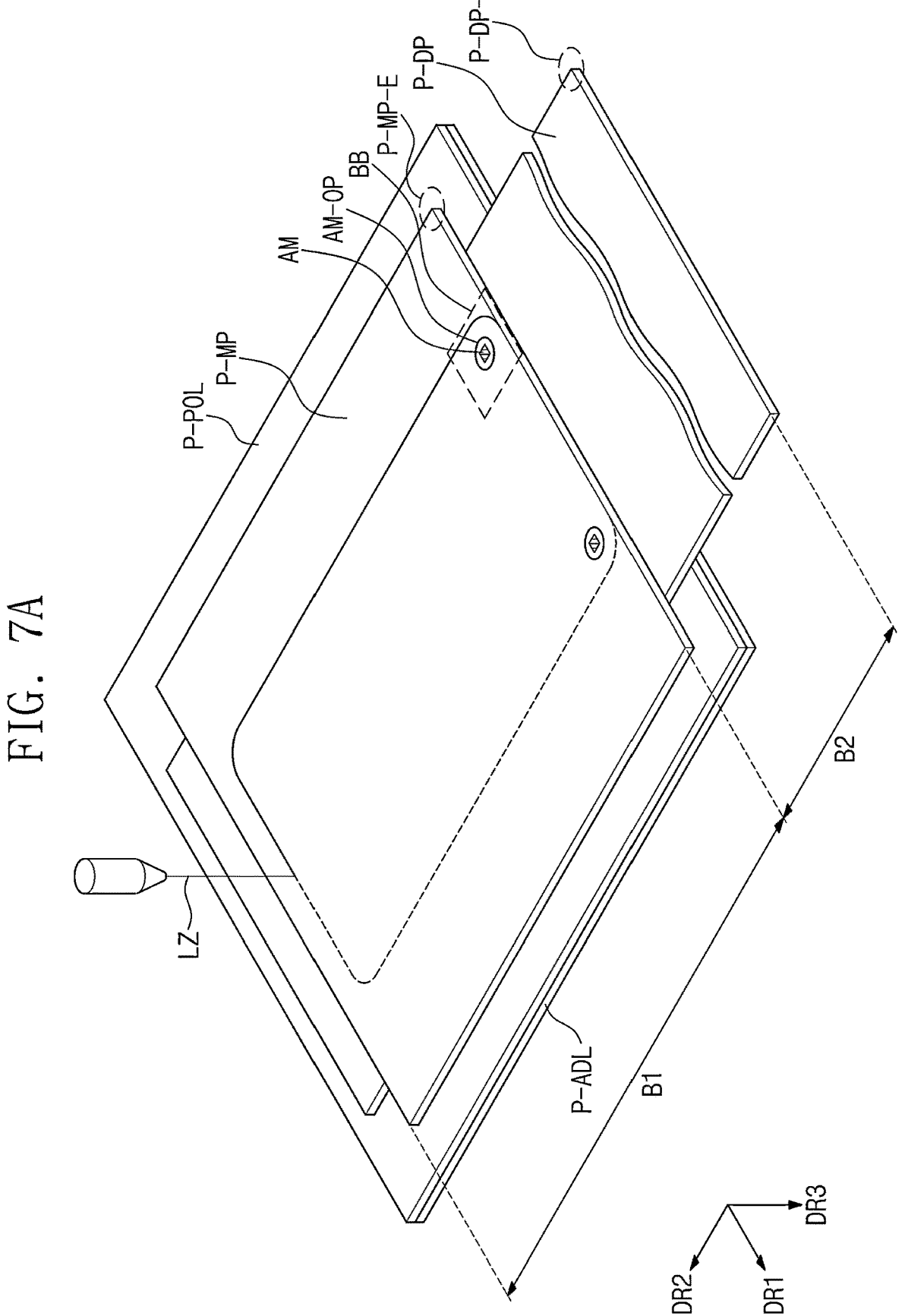
FIG. 7A is a view schematically illustrating an operation of a manufacturing method of a display device according to an embodiment.
Figure 7B:
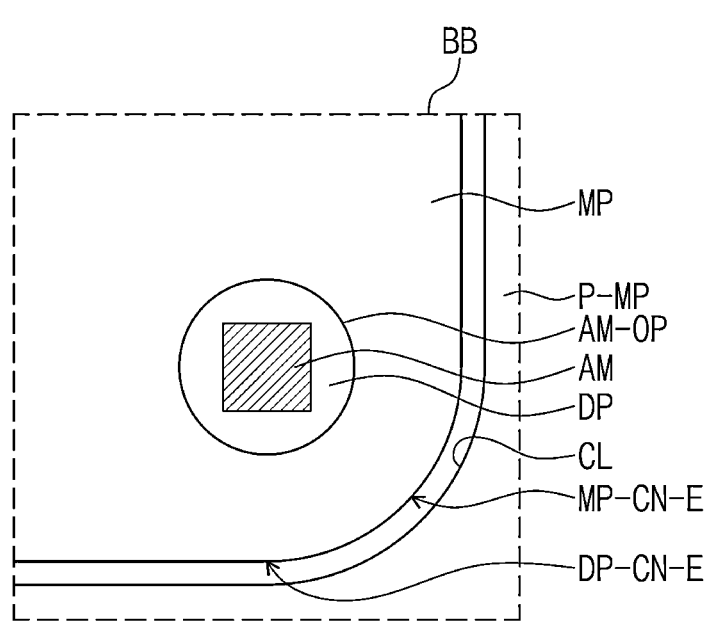
FIG. 7B is a view schematically illustrating an operation of a manufacturing method of the display device according to an embodiment.
Figure 8:
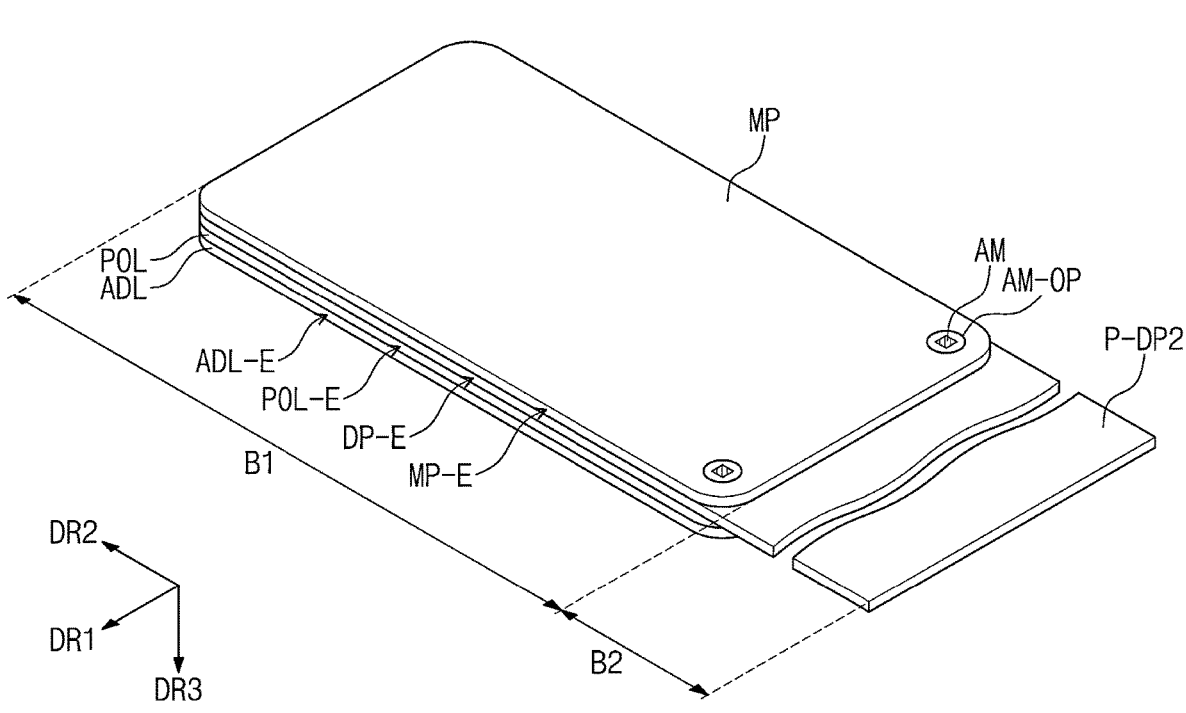
FIG. 8 is a view schematically illustrating an operation of a manufacturing method of a display device according to an embodiment.

FIG. 5 is a flowchart of a manufacturing method of a display device according to an embodiment. FIG. 6 is a view schematically illustrating an operation of a manufacturing method of a display device according to an embodiment. FIG. 7A is a view schematically illustrating an operation of a manufacturing method of a display device according to an embodiment. FIG. 7B is a view schematically illustrating an operation of a manufacturing method of the display device according to an embodiment. FIG. 8 is a view schematically illustrating an operation of a manufacturing method of a display device according to an embodiment.

Referring to FIG. 5, the manufacturing method of the display device according to an embodiment may include providing (or preparing) a preliminary display panel including an alignment part (S100), providing, on the preliminary display panel, a preliminary support member which has a greater area than the preliminary display panel and in which a support opening is defined (S300), providing the preliminary support member on the preliminary display panel such that the support opening and the alignment part are overlapped (or overlap each other) (S500), and simultaneously cutting the preliminary support member and the preliminary display panel by irradiating the preliminary support member with a laser (S700).

In an embodiment, the manufacturing method of the display device may further include providing a preliminary polarizing plate P-POL on the preliminary display panel P-DP, and also may further include providing a preliminary adhesive layer P-ADL on the preliminary polarizing plate P-POL. The providing of the preliminary polarizing plate P-POL on the preliminary display panel P-DP and the providing of the preliminary adhesive layer P-ADL on the preliminary polarizing plate P-POL may each be performed before the simultaneously cutting of the preliminary support member and the preliminary display panel by irradiating the preliminary support member with a laser (S700). In an alternative embodiment, the providing of the preliminary polarizing plate P-POL on the preliminary display panel P-DP and the providing of the preliminary adhesive layer P-ADL on the preliminary polarizing plate P-POL may be omitted.

FIG. 6 is a view schematically illustrating an operation of providing a preliminary support member P-MP on a preliminary display panel P-DP (S500) such that a support opening AM-OP and an alignment part AM are overlapped or overlap each other.

The preliminary display panel P-DP may be divided into a first region B1 and a second region B2 which are arranged in the first direction DR1. The first region B1 may overlap the preliminary support member P-MP. The second region B2 may not overlap the preliminary support member P-MP. The area of the first region B1 of the preliminary display panel P-DP may be smaller than the area of the preliminary support member P-MP.

The area of the preliminary support member P-MP may be greater than the area of the first region B1 of the preliminary display panel P-DP. The preliminary support member P-MP may be provided with the support opening AM-OP defined therein. The support opening AM-OP may expose the alignment part AM of the preliminary display panel P-DP.

FIGS. 7A and 7B are respectively views schematically illustrating an operation of simultaneously cutting a preliminary support member and a preliminary display panel by irradiating the preliminary support member with a laser. FIG. 8 illustrates the result obtained by simultaneously cutting the preliminary support member and the preliminary display panel.

Referring to FIGS. 7A and 7B, in an embodiment, the manufacturing method of the display device may include irradiating the preliminary support member P-MP with a laser LZ. The irradiating of the preliminary support member P-MP with the laser LZ may include irradiating the preliminary support member P-MP with the laser LZ toward a preliminary display panel P-DP. The irradiating of the preliminary support member P-MP with the laser LZ may include simultaneously cutting the preliminary support member P-MP and the preliminary display panel P-DP.

Accordingly, a formed edge portion MP-CN-E of a corner portion of a support member MP may be aligned, in the thickness direction, with a formed edge portion DP-CN-E of a corner portion of a preliminary display panel P-DP2. That is, at least one edge portion DP-E of the preliminary display panel P-DP2 may be aligned, in the thickness direction, with at least one edge portion MP-E of the support member MP.

The simultaneously cutting of the preliminary support member P-MP and the preliminary display panel P-DP may include cutting a section between a support opening AM-OP and an edge portion P-MP-E of the preliminary support member P-MP on the basis of the preliminary support member P-MP. Therefore, the preliminary support member P-MP and the preliminary display panel P-DP may be simultaneously cut without damage to an alignment part AM exposed by the opening AM-OP.

The manufacturing method of the display device according to an embodiment includes simultaneously cutting the preliminary display panel P-DP and the preliminary support member P-MP in which the opening AM-OP exposing the alignment part AM is defined and which has a greater area than an area of a first region B1 in the preliminary display panel P-DP, thereby making it possible to manufacture the display device without damage to the alignment part AM. The display panel DP and other components are aligned with each other and then bonded using the alignment part AM which has been exposed without being damaged, and it is thus possible to provide the display device DD with the improved bonding reliability.

The irradiating of the preliminary support member P-MP with the laser LZ may include simultaneously cutting the preliminary support member P-MP, the preliminary display panel P-DP, and a preliminary polarizing plate P-POL. Accordingly, at least one edge portion DP-E of the preliminary display panel P-DP2, at least one edge portion MP-E of the support member MP, and at least one edge portion POL-E of a polarizing plate POL may be aligned with each other in the thickness direction.

The irradiating of the preliminary support member P-MP with the laser LZ may include simultaneously cutting the preliminary support member P-MP, the preliminary display panel P-DP, the preliminary polarizing plate P-POL, and a preliminary adhesive layer P-ADL. The irradiating of the preliminary support member P-MP with the laser LZ may include simultaneously cutting the preliminary support member P-MP, the preliminary display panel P-DP, the preliminary polarizing plate P-POL, and a preliminary adhesive layer P-ADL. Accordingly, at least one edge portion DP-E of the preliminary display panel P-DP2, at least one edge portion MP-E of the support member MP, at least one edge portion POL-E of the polarizing plate POL, and at least one edge portion ADL-E of the adhesive layer ADL may be aligned in the thickness direction.

In an embodiment, a cutting line CL may be defined outside the support opening AM-OP. The cutting line CL may be adjacent to the support opening AM-OP. The cutting line CL may be defined between the edge portion of the preliminary support member P-MP and the support opening AM-OP.

Figure 9:
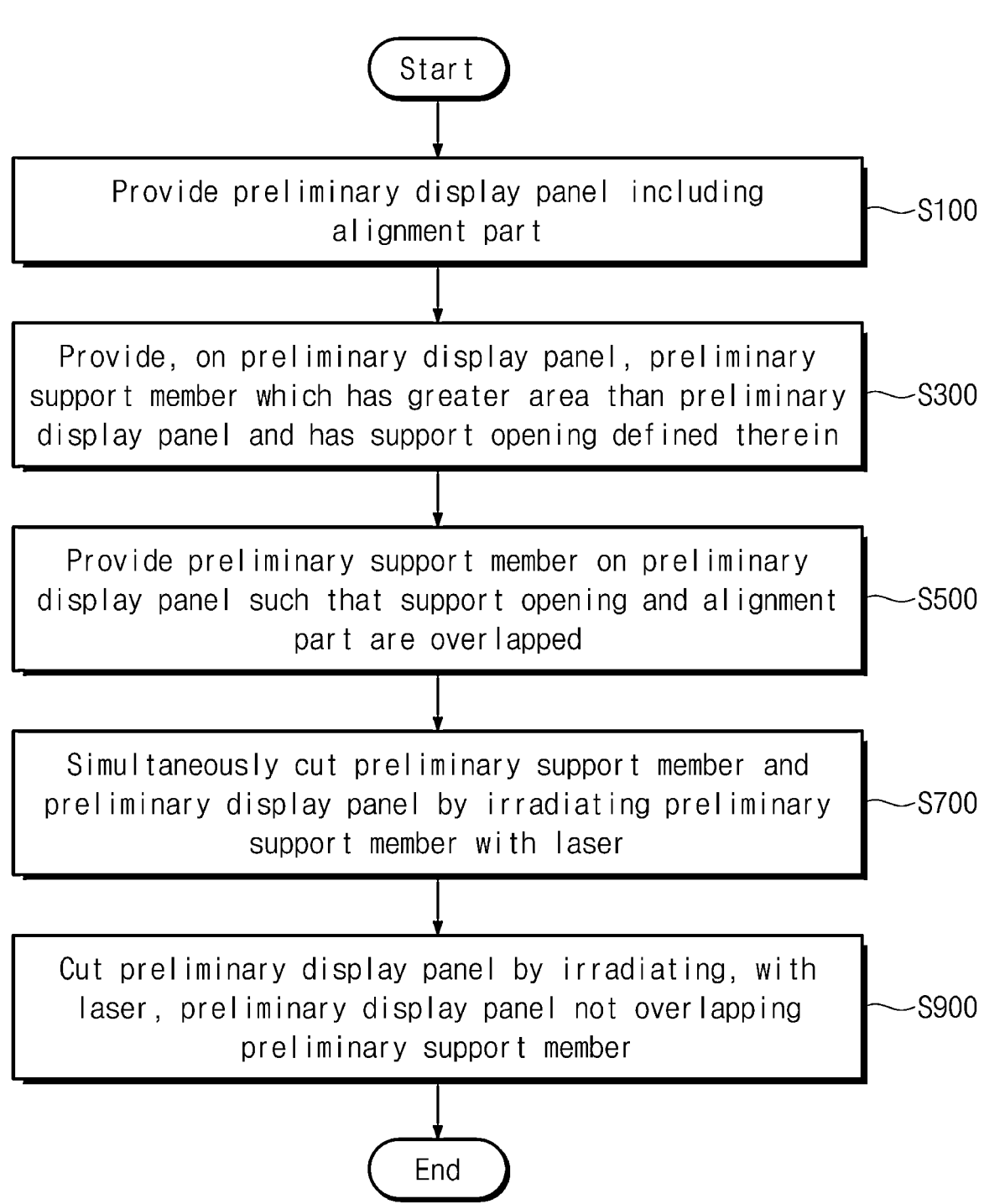
FIG. 9 is a flowchart illustrating a manufacturing method of a display device according to an embodiment.
Figure 10:
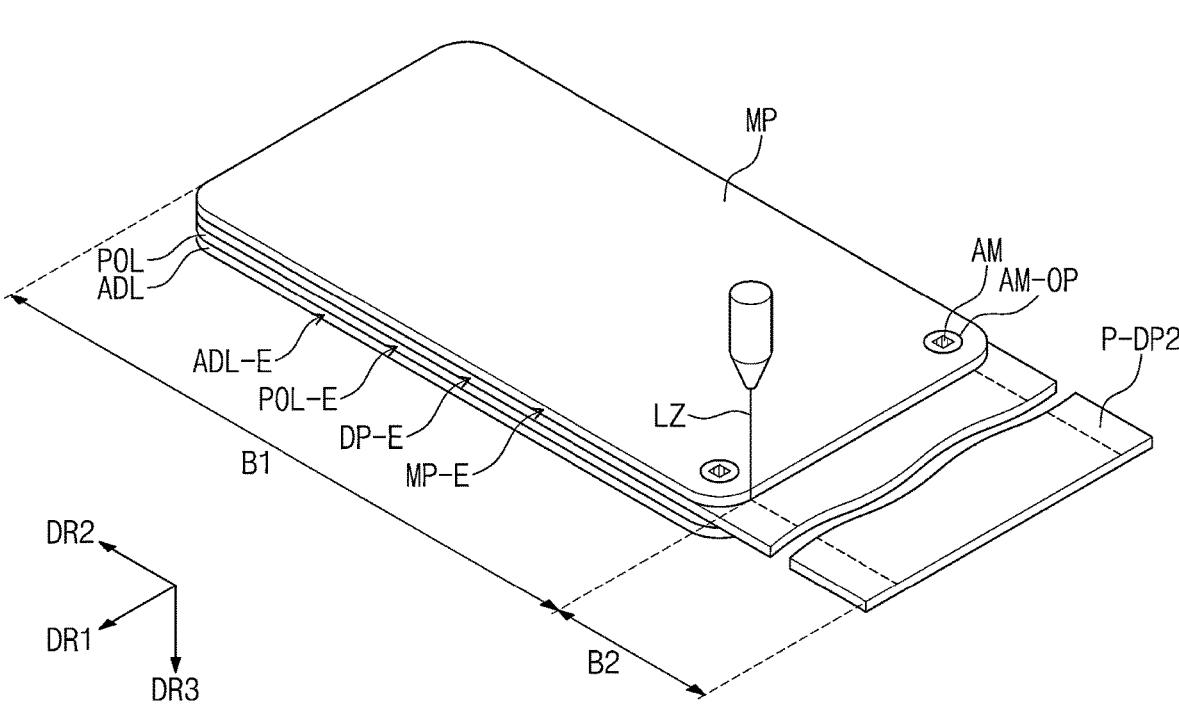
FIG. 10 is a view schematically illustrating an operation of a manufacturing method of a display device according to an embodiment.

FIG. 9 is a flowchart illustrating a manufacturing method of a display device according to an embodiment. FIG. 10 is a view schematically illustrating an operation of a manufacturing method of a display device according to an embodiment.

Referring to FIGS. 9 and 10, the manufacturing method of the display device according to an embodiment may further include, after simultaneously cutting a preliminary support member and a preliminary display panel by irradiating the preliminary support member with a laser (S700), cutting the preliminary display panel P-DP2 by irradiating, with a laser LZ, a portion of the preliminary display panel P-DP2 not overlapping a preliminary support member P-MP (S900). Therefore, it is possible to manufacture the display device DD, illustrated in FIGS. 2A and 2B, including the display panel DP divided into the first region A1, the second region A2, and the third region A3.

Figure 11A:
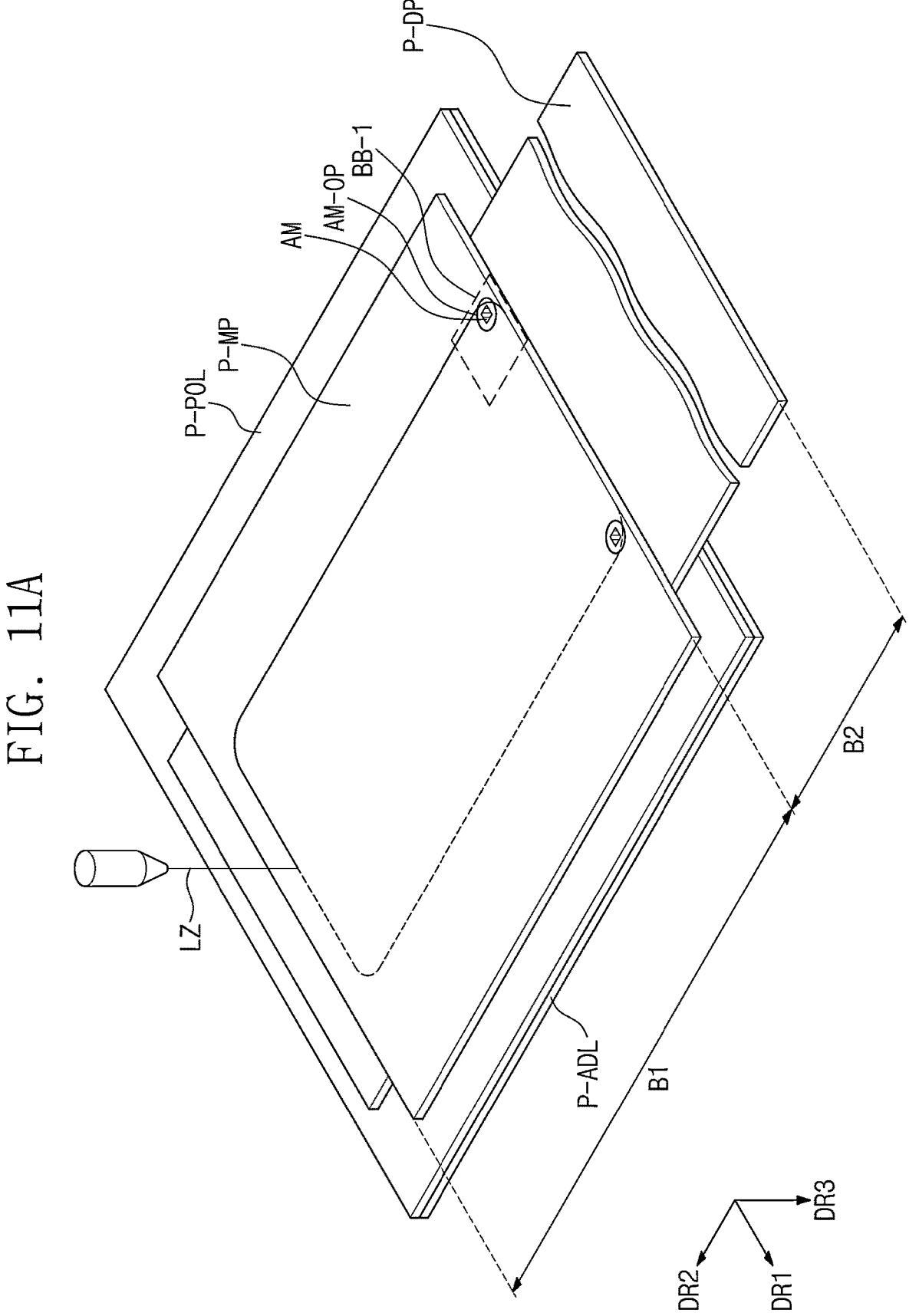
FIG. 11A is a view schematically illustrating a manufacturing method of a display device according to an embodiment.
Figure 11B:
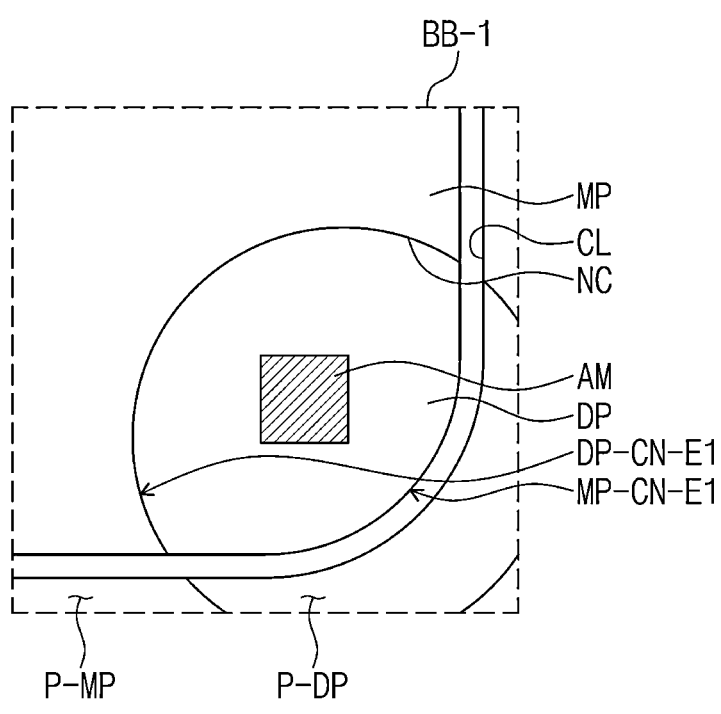
FIG. 11B is a view schematically illustrating a manufacturing method of the display device according to an embodiment.

FIG. 11A is a view schematically illustrating a manufacturing method of a display device according to an embodiment. FIG. 11B is a view schematically illustrating a manufacturing method of the display device according to an embodiment.

FIGS. 11A and 11B are views schematically illustrating an operation of simultaneously cutting a preliminary support member and a preliminary display panel by irradiating the preliminary support member with a laser. FIGS. 11A and 11B differ from FIGS. 7A and 7B in that the preliminary display panel exposed through an opening is irradiated with a laser.

Referring to FIGS. 11A and 11B, in an embodiment, the simultaneously cutting of the preliminary support member P-MP and the preliminary display panel P-DP by irradiating the preliminary support member P-MP with a laser LZ (S700) may include cutting, with the laser LZ, the preliminary display panel P-DP exposed by a support opening AM-OP. The cutting of the preliminary display panel P-DP exposed by the support opening AM-OP with the laser LZ may include cutting a section between an alignment part AM and an edge portion P-DP-E of the preliminary display panel P-DP on the basis of the preliminary display panel P-DP. Accordingly, as illustrated in FIG. 4, the display device DD in which the recessed portion NC is defined in the support member MP-1 may be manufactured. Since the manufacturing method of the display device according to an embodiment includes the cutting of the preliminary display panel P-DP exposed by the support opening AM-OP with the laser LZ, the alignment part AM may be exposed without being damaged and it is thus possible to provide the display device with the improved bonding reliability.

Figure 12:
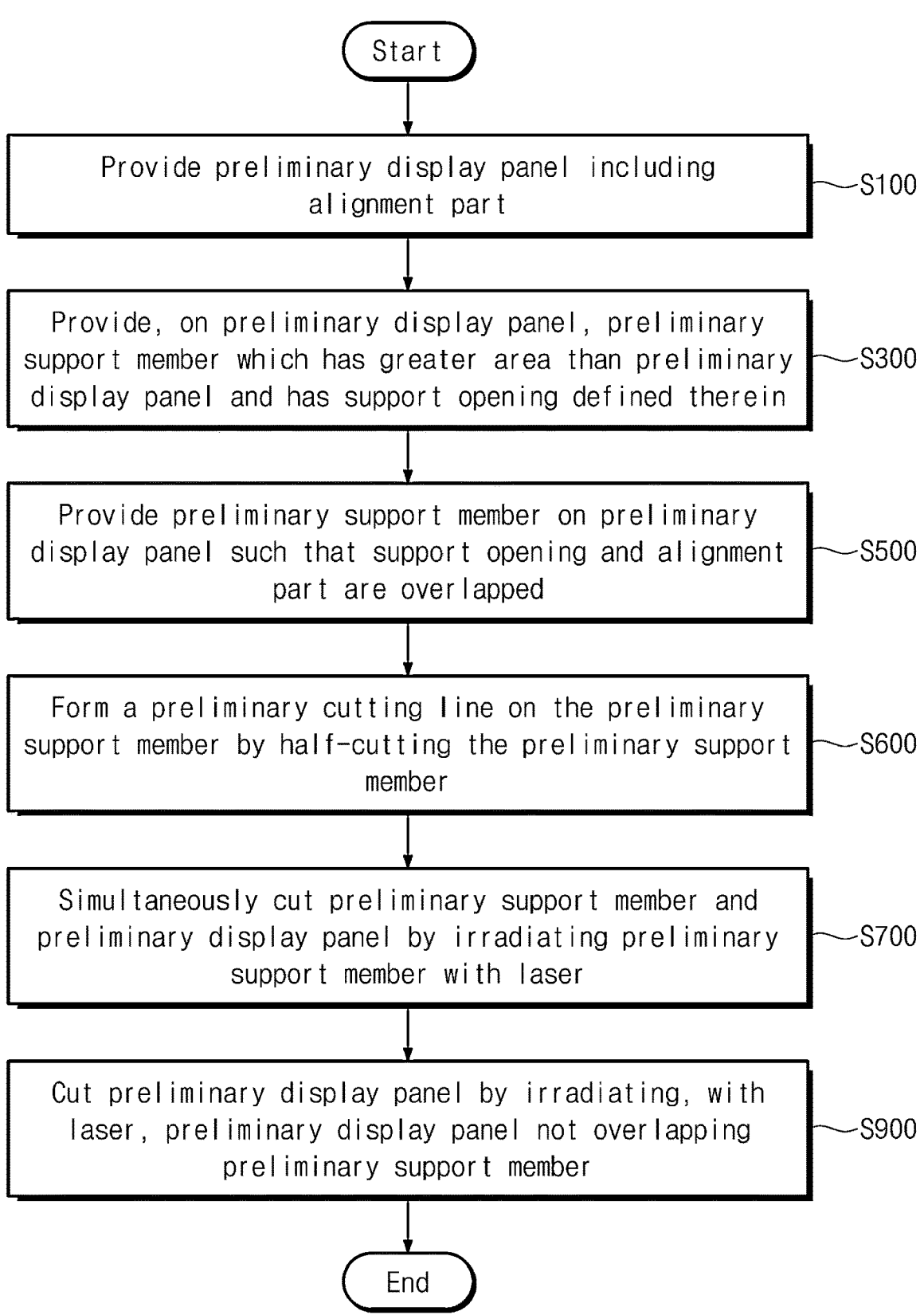
FIG. 12 is a flowchart schematically illustrating a manufacturing method of a display device according to an embodiment.
Figure 13A:
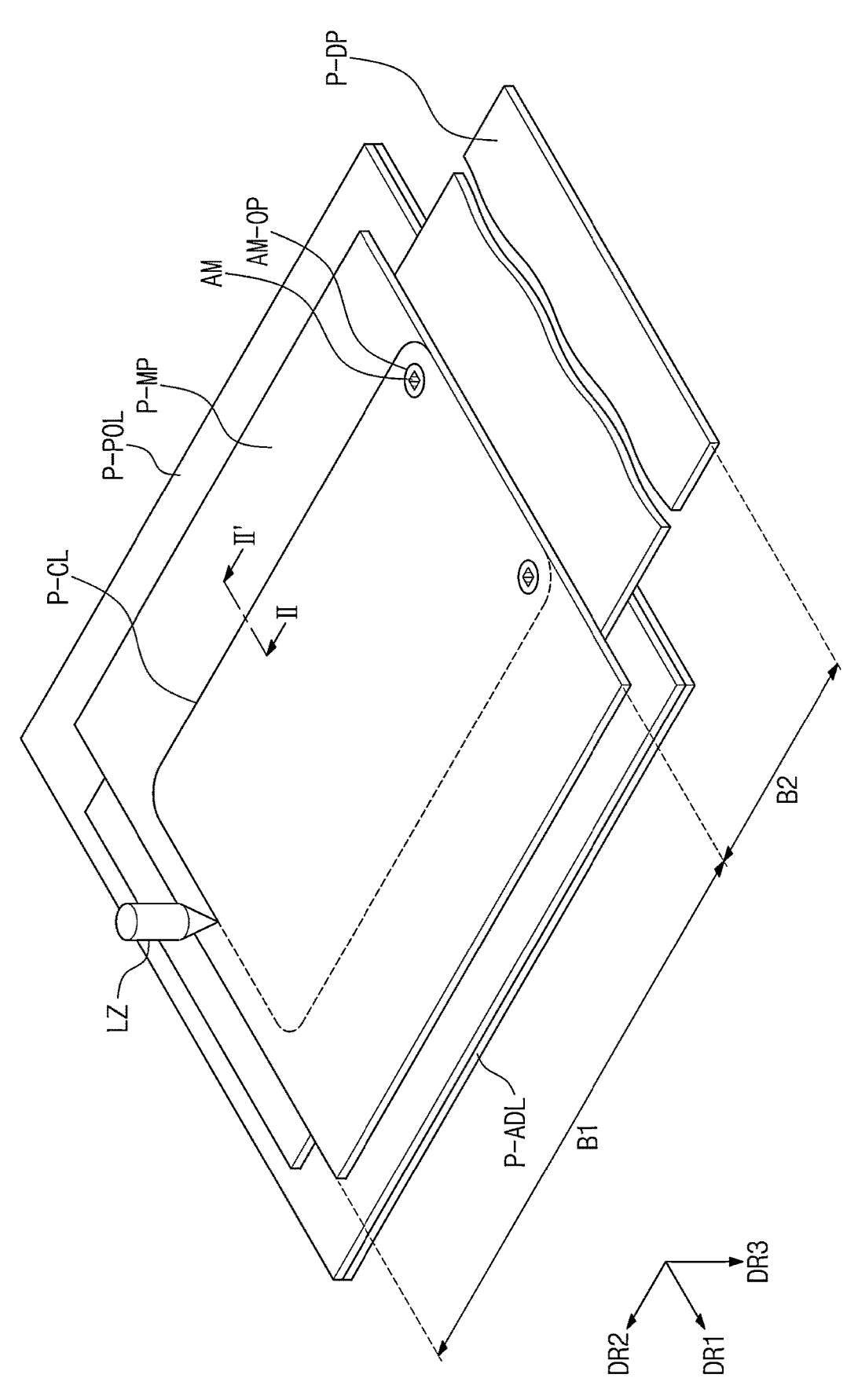
FIG. 13A is a view schematically illustrating an operation of a manufacturing method of a display device according to an embodiment.
Figure 13B:
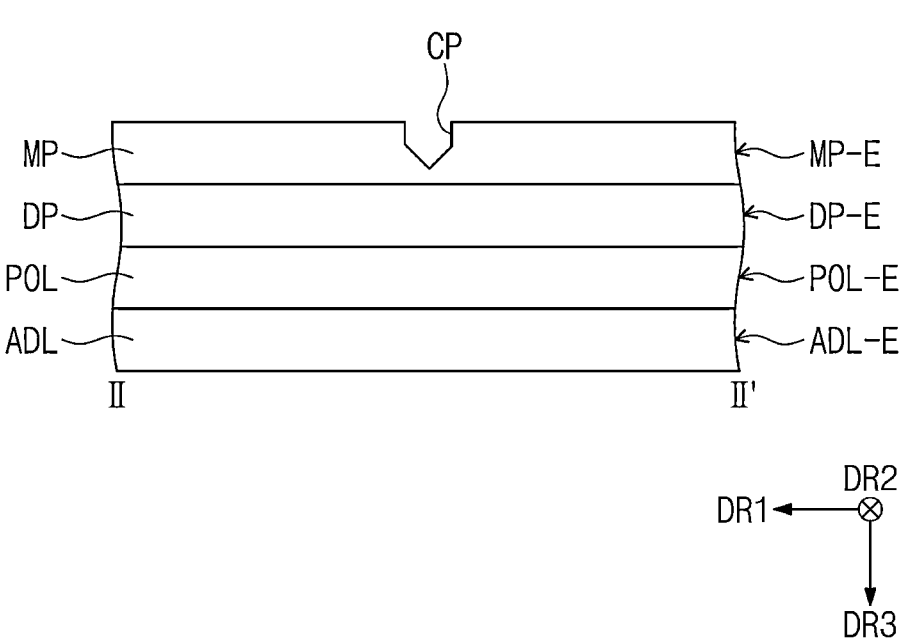
FIG. 13B is a view schematically illustrating an operation of a manufacturing method of the display device according to an embodiment.

FIG. 12 is a flowchart schematically illustrating a manufacturing method of a display device according to an embodiment. FIGS. 13A and 13B are views schematically illustrating an operation of a manufacturing method of a display device according to an embodiment.

FIGS. 13A and 13B are respectively views schematically illustrating an operation of forming a preliminary cutting line on a preliminary support member by half-cutting the preliminary support member.

Referring to FIGS. 12 to 13B, the manufacturing method of the display device according to an embodiment may further include, between the providing of a preliminary support member P-MP on a preliminary display panel P-DP (S500) and the simultaneously cutting of the preliminary support member P-MP and the preliminary display panel P-DP by irradiating the preliminary support member P-MP with a laser LZ (S700), forming a preliminary cutting line P-CL on the preliminary support member P-MP by half-cutting the preliminary support member P-MP (S600).

The forming of the preliminary cutting line P-CL on the preliminary support member P-MP may include half-cutting a portion of the preliminary support member P-MP, using a cutter CT. When viewed on a plane or in the third direction DR3, the half-cut preliminary support member P-MP may have a half-cut portion CP which is defined therein and recessed toward the preliminary display panel P-DP from a surface of the preliminary support member P-MP spaced apart from the preliminary display panel P-DP.

The simultaneously cutting of the preliminary support member P-MP and the preliminary display panel P-DP by irradiating the preliminary support member P-MP with the laser LZ may include irradiating the preliminary cutting line P-CL with the laser LZ. The manufacturing method of the display device according to an embodiment includes the half-cutting of the preliminary support member P-MP, so that the simultaneously cutting of the preliminary support member P-MP and the preliminary display panel P-DP by being irradiated with the laser LZ may be performed more easily.

A display device according to an embodiment may include a display panel and a support member which have edge portions aligned with each other in the thickness direction. The support member entirely exposes an alignment part of the display panel through an opening or a recessed portion defined therein. Therefore, the display device according to an embodiment may exhibit the improved bonding reliability with other components.

A manufacturing method of a display device according to an embodiment includes providing, on a display panel in which an alignment part is disposed, a support member in which an opening exposing the alignment part is defined, and simultaneously cutting the display panel and the support member, by simultaneously cutting the display panel and the support member, it is possible to prevent the exposed alignment part from being damaged or shielded. Therefore, the manufactured display device may exhibit the improved bonding reliability.

In a display device according to an embodiment, since an edge of a side portion of a display panel overlaps an edge of a support side portion of a support member, and the support member exposing an alignment part is included, improved bonding reliability may be exhibited.

A manufacturing method of a display device according to an alternative embodiment includes providing, on a preliminary display panel, a preliminary support member which has a greater area than the preliminary display panel and in which a support opening is defined, thereby making it possible to provide a display device in which an alignment part is exposed.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a display panel which is divided into a first region including pixels and having a corner portion, in which an alignment part is disposed, and a side portion adjacent to the corner portion, a second region bent with respect to an imaginary bending axis extending in a first direction, and a third region in which a driver chip electrically connected to the pixels is mounted; and
   a support member which is disposed below the first region of the display panel, includes a support corner portion and a support side portion adjacent to the support corner portion, wherein the support corner portion does not overlap the alignment part in a thickness direction, wherein an edge of the side portion is aligned with an edge of the support side portion in the thickness direction.

2. The display device of claim 1, wherein the support member is provided with an opening which is defined in a portion adjacent to the support corner portion and overlaps the alignment part, and the alignment part is entirely exposed from the opening.

3. The display device of claim 2, wherein an edge of the support corner portion is aligned with an edge of the corner portion in the thickness direction.

4. The display device of claim 2, wherein when viewed in the thickness direction, an area of the opening is greater than an area of the alignment part.

5. The display device of claim 1, wherein an edge portion of the support corner portion has a shape recessed toward the inside of the support member and is disposed further inward than an edge portion of the corner portion, and the alignment part is disposed between the edge portion of the support corner portion and the edge portion of the corner portion.

6. The display device of claim 1, further comprising:

a polarizing layer disposed on the display panel, wherein the polarizing layer includes a polarizing corner portion and a polarizing side portion adjacent to the polarizing corner portion, and an edge of the polarizing side portion is aligned, in the thickness direction, with the edge of the support side portion and the edge of the side portion.

7. The display device of claim 6, further comprising:

an adhesive layer disposed on the polarizing layer, wherein the adhesive layer includes an adhesive corner portion and an adhesive side portion adjacent to the adhesive corner portion, an edge of the adhesive side portion is aligned, in the thickness direction, with the edge of the polarizing side portion, the edge of the support side portion, and the edge of the side portion.

8. The display device of claim 1, wherein the side portion comprises a first side portion, a second side portion opposite to the first side portion, and a third side portion disposed between the first side portion and the second side portion, the support side portion comprises a first side support portion, a second side support portion opposite to the first side support portion, a third side support portion disposed between the first side support portion and the second side support portion, and a fourth side support portion opposite to the third side support portion, an edge portion of the first side portion is aligned with an edge of the first side support portion in the thickness direction, an edge portion of the second side portion is aligned with an edge of the second side support portion in the thickness direction, an edge portion of the third side portion is aligned with an edge of the third side support portion in the thickness direction, and the fourth side support portion is more adjacent to the second region than the first side support portion.

9. The display device of claim 1, wherein the support member is provided with a first component opening defined therein, and the display panel is provided with a second component opening defined, in the first region, in a portion thereof corresponding to the first component opening, the display device further comprises an electronic component overlapping the first component opening and the second component opening.

10. An electronic device comprising:

a display device comprising:

a display panel which is divided into a first region including pixels and having a corner portion, in which an alignment part is disposed, and a side portion adjacent to the corner portion, a second region bent with respect to an imaginary bending axis extending in a first direction, and a third region in which a driver chip electrically connected to the pixels is mounted; and a support member which is disposed below the first region of the display panel, includes a support corner portion and a support side portion adjacent to the support corner portion, wherein the support corner portion does not overlap the alignment part in a thickness direction, wherein an edge of the side portion is aligned with an edge of the support side portion in the thickness direction.

* * * * *